United States Patent [19]

Oshima

[11] Patent Number: 5,747,875
[45] Date of Patent: May 5, 1998

[54] SEMICONDUCTOR POWER MODULE WITH HIGH SPEED OPERATION AND MINIATURIZATION

[75] Inventor: Seiichi Oshima, Fukuoka, Japan

[73] Assignee: Mitsubishi Denki Kabushiki Kaisha, Tokyo, Japan

[21] Appl. No.: 675,337

[22] Filed: Jul. 2, 1996

Related U.S. Application Data

[63] Continuation of Ser. No. 305,395, Sep. 13, 1994, abandoned.

[51] Int. Cl.$^6$ .......................... H01L 23/043; H01L 23/10
[52] U.S. Cl. .......................... 257/687; 257/718; 257/719; 257/724
[58] Field of Search .................. 257/701–703, 257/705, 706, 712, 718, 719, 724, 687, 690

[56] References Cited

U.S. PATENT DOCUMENTS 5,521,437  5/1996  Oshima et al. .................. 257/701

FOREIGN PATENT DOCUMENTS

| 0547877 | 6/1993 | European Pat. Off. | 257/724 |
| 0185954 | 8/1986 | Japan . | |
| 0273150 | 9/1992 | Japan . | |
| 0151632 | 5/1994 | Japan | 257/724 |

*Primary Examiner*—Peter Toby Brown
*Attorney, Agent, or Firm*—Oblon, Spivak, McClelland, Maier & Neustadt, P.C.

[57] ABSTRACT

In order to obtain a miniature unit having a simple structure which can operate at a high speed at a low cost, a copper pattern (225) provided on a power substrate (221) having a DBC substrate structure is exposed on an outer surface of the unit. Thus, it is possible to discharge heat which is generated in a main circuit of the unit to the exterior without providing a copper base plate by mounting the unit so that the pattern (225) is directly in contact with an external heat slinger or the like. The power substrate (221) is not deformed following its temperature change, since no copper base plate is required. Thus, no S-bent structure is required for a terminal which is connected with the circuit or the like, whereby speed increase and miniaturization are enabled, while the structure is simplified since no silicone gel is required.

18 Claims, 16 Drawing Sheets

SEMICONDUCTOR POWER MODULE WITH HIGH SPEED OPERATION AND MINIATURIZATION

This application is a Continuation of application Ser. No. 08/305,395, filed on Sep. 13, 1994, now abandoned.

BACKGROUND OF THE INVENTION

1. Field of the Invention

The present invention relates to a semiconductor power module, and more particularly, it relates to an improvement for preventing deformation of a circuit board following a temperature change in the circuit board.

2. Background of the Invention

A semiconductor power module is a unit comprising a circuit for adjusting power which is supplied to a load with an active power switching semiconductor element carrying out a switching operation. There has been developed a semiconductor power module, called an "intelligent power module" in particular, which further comprises a control circuit having an active semiconductor element for controlling the operation of the aforementioned circuit, serving as a main circuit, by exchanging signals with the main circuit. Such a semiconductor power module is mainly applied to an inverter for controlling the operation of a motor or the like.

<Circuit Diagram of Conventional Unit>

FIG. 12 is a schematic circuit diagram showing a principal portion of a circuit 110 provided in a conventional semiconductor power module 100. This unit 100 has a rated output voltage and a maximum output current of 440 V and 100 A respectively. Further, the frequency of an operation for cutting off or connecting the output current is 10 kHz.

The circuit 110 has two circuit parts 120 and 130. The main circuit 120 is a circuit part for outputting adjusted power to a load. A dc high potential P and a dc low potential N are applied from an external power source (not shown) to two power supply terminals PS(P) and PS(N) respectively. Namely, the main circuit 120 is supplied with power from the external power source through the power supply terminals PS(P) and PS(N). The main circuit 120 comprises six IGBT elements (insulated gate bipolar transistors) T1 to T6, which are active elements for power control. Each IGBT element is a power switching semiconductor element, which repetitively cuts off and connects a current to be supplied to a load. These IGBT elements T1 to T6 control the inputted power in correspondence to three phases of U, V and W, and output the controlled power to the load through three output terminals OUT(U), OUT(V) and OUT(W). Freewheel diodes D1 to D6 are connected in parallel with the IGBT elements T1 to T6 respectively, for protecting the IGBT elements T1 to T6 when inverted voltages are applied thereto by bypassing the load currents.

The control circuit 130 is a circuit part for controlling the operations of the IGBT elements T1 to T6. This control circuit 130 comprises six active semiconductor elements IC1 to IC6. These semiconductor elements IC1 to IC6 transmit gate voltage signals $V_G1$ to $V_G6$ to gates G of the IGBT elements T1 to T6 in response to input signals $V_{IN}1$ to $V_{IN}6$ which are inputted at signal input terminals IN1 to IN6 respectively. The IGBT elements T1 to T6 cut off and connect currents across collectors C and emitters E in response to the gate voltage signals $V_G1$ to $V_G6$.

Four independent external dc voltage sources (not shown) are connected to respective pairs of high potential side (positive) power supply terminals $V_{CC}1$ to $V_{CC}4$ and low potential side (negative) power supply terminals $V_{EE}1$ to $V_{EE}4$, so that dc voltages are supplied to the semiconductor elements IC1 to IC6 through these power supply terminals. The negative power supply terminals $V_{EE}1$ to $V_{EE}3$ are electrically connected with the emitters E of the IGBT elements T1 to T3 respectively, while the negative power supply terminal $V_{EE}4$ is connected to the emitters E of the IGBT elements T4 to T6 which are at the common potentials.

The main circuit 120, which is fed with a relatively large current, is designed to be resistant against a high current and heat generation following the high current. On the other hand, the control circuit 130 which is adapted to process voltage signals is fed with a small current. Therefore, the control circuit 130 is not designed to cope with a high current.

<Appearance of Unit 100>

FIG. 13 is a perspective view showing the appearance of the unit 100. The unit 100 comprises a case 101 which is made of an insulator such as synthetic resin, and a cover 102 is provided on its upper surface. Terminals 103 of the main circuit 120 and terminals 104 of the control circuit 130 are outwardly exposed on the upper surface of the case 101. In these terminals 103 and 104, portions identical to those in the circuit diagram of FIG. 12 are denoted by the same symbols.

<Arrangement of Circuit Elements in Main Circuit 120>

FIG. 14 is a plan view of a circuit board 121 for the main circuit 120 which is stored in a prescribed position of the case 101. The circuit board 121 comprises four circuit board bodies 121a to 121d. These circuit board bodies 121a to 121d are arranged on an upper surface of a plate type copper base 122 forming the bottom surface of the case 101. The IGBT elements T1 to T6, the freewheel diodes D1 to D6 which are passive circuit elements pertaining thereto, and interconnection patterns are provided on the circuit board bodies 121a and 121b. Interconnection patterns P(P), P(N), P(U), P(V) and P(W) are those of the high potential P, the low potential N, a U-phase output, a V-phase output and a W-phase output respectively. These interconnection patterns are sufficient in width and thickness for passing a high current. The interconnection patterns are connected with corresponding ones of the power supply terminals PS(P) and PS(N) and the output terminals OUT(U), OUT(V) and OUT(W) in slant portions respectively.

The circuit board bodies 121c and 121d are body parts of the circuit board 121 relaying the IGBT elements T1 to T6 and the control circuit 130 with each other. Among those which are formed on these circuit board bodies 121c and 121d, interconnection patterns P(E1) to P(E6) are connected to the emitters E of the IGBT elements T1 to T5 respectively, while interconnection patterns P(G1) to P(G6) are connected to the gates G of the IGBT elements T1 to T6 respectively. Each of the IGBT elements T1 to T6 comprises a detection circuit which detects the value of a current (collector current) flowing in a collector C of each element, for transmitting a voltage signal corresponding to the collector current. Interconnection patterns P(S1) to P(S6) are connected to the detection circuits provided in the IGBT elements T1 to T6 respectively, to transmit the detection signals for the collector currents. Interconnection patterns P(EX) are adapted to transmit other signals.

These interconnection patterns are connected to ends of a plurality of conductor pins (described later), which are connected to the control circuit 130, in slant portions respectively. Namely, these interconnection patterns are electrically connected to the control circuit 130 through the conductor pins. A number of conductor wires w properly electrically connect the aforementioned elements with each other and with the interconnection patterns.

<Arrangement of Circuit Elements of Control Circuit 130>

FIG. 15 is a plan view of a circuit board 131 for the control circuit 130. The control circuit 130 is developed on the board which is different from that of the main circuit 120 generating high heat. The active semiconductor elements IC1 to IC7, various passive circuit elements EL pertaining thereto, and interconnection patterns are provided on the circuit board 131. The semiconductor element IC7 is provided with an object which is different from those of the semiconductor elements IC1 to IC6.

The circuit board 131 is provided with through holes TH which are connected with the interconnection patterns, and other ends of the aforementioned conductor pins are connected to these through holes TH. The through holes TH(E1) to TH(E6), TH(G1) to TH(G6), TH(S1) to TH(S6) and TH(EX) are connected to the aforementioned interconnection patterns P(E1) to P(E6), P(G1) to P(G6), P(S1) to P(S6) and P(EX) respectively. The circuit board 131 is provided with the terminals 104 which are connected with the interconnection patterns as well as the aforementioned external power source and the like.

<Sectional Structure of Unit 100>

FIG. 16 is a front sectional view of the unit 100. The circuit boards 131 and 121 are arranged on upper and lower portions of the unit 100 to be opposed to each other. The circuits provided on the circuit boards 121 and 131 are properly electrically connected with each other through the aforementioned plurality of conductor pins PI. The circuit board bodies 121a and 121b which are provided with the IGBT elements T1 to T6 accompanied with high heat generation are made of ceramic such as aluminum oxide (Al$_2$O$_3$) or aluminum nitride (AlN) having heat resistance and electric insulativity, while bottom surfaces thereof are entirely covered with copper thin plates CF. Surfaces of these copper thin plates CF are soldered onto an upper surface of the copper base 122, to fix the circuit board bodies 121a and 121b to the copper base 122. Copper interconnection patterns such as the interconnection patterns P(N), P(W) and the like are formed on the upper surface of the circuit board 121, while the circuit elements such as the IGBT elements T3, T6 and the like are soldered to upper surfaces thereof. The interconnection patterns and the copper thin plates CF are metallization-bonded to the circuit board bodies 121a and 121b. These substrates formed by metallization bonding are called DBC substrates. In the DBC substrates, thicknesses of the insulating circuit board bodies 121a and 121b, the copper thin plates CF and the interconnection patterns are 0.635 mm, 0.2 mm and 0.3 mm respectively, for example.

The copper base 122 substantially entirely occupying the bottom surface of the unit 100 is mainly adapted to radiate heat. Namely, the unit 100 is so mounted that the copper base 122 is in contact with an externally provided heat slinger or the like, for discharging heat loss which is caused in the main circuit 120 to an external heat radiating mechanism such as the heat slinger, thereby preventing the main circuit 120 and the control circuit 130 from excess temperature increase.

The body of the cover 102 is made of an electric insulator such as synthetic resin, and a copper sheet 105 is stuck substantially entirely to its lower surface. An internal space 109 which is enclosed by the copper base 122, the case 101 and the cover 102 is filled up with silicone resin and epoxy resin, for protecting the circuit elements. In more concrete terms, portions close to the DBC substrates and S-bent portions such as the power supply terminals PS(P) and PS(N) and the conductor pins PI are filled up with silicone resin, while other portions of the internal space are filled up with epoxy resin.

<Problems of Conventional Unit>

In the conventional semiconductor power module, the DBC substrates provided with the circuit elements accompanied by heat generation such as the IGBT elements T1 to T6 are soldered to the copper base 122, as hereinabove described. However, thermal expansion coefficients of aluminum oxide and aluminum nitride are 7.3 µ/deg and 4.7 µ/deg respectively, while that of the copper base 122 is 16.6 µ/deg. Namely, the insulating substrate body dominating thermal expansion of the DBC substrates and the copper base 122 are considerably different in thermal expansion coefficient from each other. These elements have no thermal distortion under a temperature for soldering the same with each other, i.e., under the melting temperature of solder. When the temperature is reduced to the room temperature after completion of soldering, the elements are thermally distorted by the so-called bimetal effect resulting from the aforementioned difference in thermal expansion coefficient. As the result, bending deformation is caused in the DBC substrates and the copper base 122 under the room temperature. Such bending deformation is increased when the unit 100 is employed at a lower temperature, while the same is reduced when the unit 100 is employed at a higher temperature. Further, heating values in the IGBT elements T1 to T6 etc. are generally varied following employment of the unit 100, whereby the temperature is also changed in response, to vary the amounts of bending deformation. Displacement in each portion of the DBC substrates and the copper base 122 caused by the amounts of bending deformation reaches about 300 µm at the maximum.

The DBC substrates may be broken by internal stress exceeding breaking strength due to bending deformation. Further, the DBC substrates may cause fatigue breaking due to repeated stress caused in its interior by repetition of temperature change. Thus, the DBC substrates may be broken by the bimetal effect in the conventional unit.

Further, the semiconductor elements IC1 to IC7 forming the control circuit 130 cannot be arranged on largely displaced DBC substrates or the substrates fixed to the copper base 122, since high operating reliability is required therefor. As shown in FIG. 16, the circuit substrate 131 provided with the semiconductor elements IC1 to IC7 etc. is spatially separated from the circuit board 121 which is soldered to the copper base 122 so that these substrates are in a "double deck" structure for this reason. Thus, the conventional unit is disadvantageously complicated in structure and increased in fabrication cost.

Further, the conductor pins PI and the terminals such as the power supply terminals PS(P) and PS(N) which are connected to the main circuit 120 have S-bent structures to be capable of following displacement of the circuit board 121. Such S-bent structures must not be prevented from deformation by the filler which is in contact therewith. Thus, it is necessary to protect the peripheries of the S-bent structures with the soft silicone resin which can absorb stress, as hereinabove described. This also brings the problems of the complicated structure of and the high fabrication cost for the unit.

The IGBT elements T1 to T6 are increasingly improved in recent years, and elements capable of operating under a high frequency of 50 kHz are now being developed. In the conventional unit, however, high-speed switching operations of the IGBT elements T1 to T6 are inhibited by high reactances of the terminals, having the S-bent structures, which are connected to the main circuit 120.

In the conventional unit, further, it is necessary to increase the distance between the circuit boards 121 and 131 in excess of a certain degree due to the S-bent structures, and hence the height of the unit must inevitably exceed a certain degree. In other words, the conventional unit inhibits implementation of miniaturization, which is one strong requirement in the market.

SUMMARY OF THE INVENTION

According to the present invention, a semiconductor power module comprises a box type housing storing a power switching semiconductor element repeating cutoff and connection of a current to be supplied to a load in response to a control signal, and a bottom portion of the housing comprises a power substrate which is integrally provided with a power substrate body containing a heat-resistant insulating material, a thermally and electrically conductive power interconnection pattern which is bonded to/arranged on an upper major surface of the power substrate body to be connected with the power switching semiconductor element, and a thermally conductive plate which is bonded to/arranged on a lower major surface of the power substrate body, while the plate has a material which is substantially identical to that of the power interconnection pattern, and is exposed on a lower surface of the housing.

In the inventive semiconductor power module according to the present invention, it is possible to discharge heat which is generated in the circuit to the exterior with no copper base plate by mounting the unit so that the plate provided on the power substrate is directly in contact with an external heat slinger or the like, whereby no bimetal effect is caused. Thus, the inventive unit has such an effect that the power substrate is not broken. A high-speed operation of the unit is enabled since no S-bent structure is required due to no bimetal effect, while the unit can be simplified in structure and reduced in fabrication cost since no filling with silicone gel is required. Further, the unit can be reduced in thickness and miniaturized due to no presence of a S-bent structure. Further, the power substrate and the control substrate are substantially flush with each other, whereby the unit can be reduced in thickness and miniaturized also by this.

Preferably, the housing comprises a bottomless case which is bonded to the bottom portion by an adhesive for covering an upper space of the bottom portion.

Preferably, the heat-resistant insulating material is ceramic, the power interconnection pattern substantially consists of a copper material and is arranged on the upper major surface of the power substrate body in metallization bonding, and the plate substantially consists of a copper material and is arranged on the lower major surface of the power substrate body in metallization bonding.

In the semiconductor power module according to the present invention, the heat-resistant insulating material for the power substrate body is prepared from ceramic while the power interconnection pattern and the plate are arranged by metallization bonding, whereby heat loss which is caused in the power switching semiconductor element and the power interconnection pattern is efficiently transmitted to the plate.

Further, adhesion strength between the power interconnection pattern, the plate and the power substrate body is so high that deterioration is hardly caused by separation or the like and the product life is improved.

Preferably, the bottom portion of the housing comprises a control substrate having a control substrate body substantially consisting of an insulator, an electrically conductive control interconnection pattern which is arranged on an upper major surface of the control substrate body and connected with a control circuit element for producing the control signal and supplying the same to the power switching semiconductor element, and a plate type pressing member, having rigidity, forming a multilayer structure with the control substrate body, while the control substrate is arranged around the power substrate and engaged with an edge portion of the power substrate.

In the semiconductor power module according to the present invention, the control substrate provided with the control circuit element for producing the control signal and transmitting the same to the power switching semiconductor element is arranged around the power substrate. Therefore, it is possible to implement a miniature unit which is further reduced in thickness. Further, the control substrate has the pressing member and is engaged with the edge of the power substrate, whereby the plate which is exposed on the outer surface of the housing can be brought into pressure contact with an external heat slinger or the like with a sufficient pressure.

Preferably, the bottom portion of the housing further comprises a plate-type spacer having an inner peripheral edge which is provided around the power substrate to be in contact with an outer peripheral edge of the power substrate, and the plate-type spacer is in contact with a lower major surface of the control substrate.

In the semiconductor power module according to the present invention, the bottom surface portion of the housing has the spacer which is in contact with the periphery of the power substrate, whereby the power substrate is positioned at a prescribed position set by the spacer.

Preferably, the ratio of the thickness of the power interconnection pattern to that of the plate is so adjusted that the power substrate is not warped following its temperature change.

In the semiconductor power module according to the present invention, the ratio of the thickness of the power interconnection pattern to that of the plate is adjusted, whereby the power substrate is not warped following its temperature change. Thus, the power substrate is prevented from breakage, while a portion connecting the power interconnection pattern with the power switching semiconductor element is inhibited from reduction in life caused by a heat cycle.

Preferably, the spacer has elasticity, and a lower surface of the spacer is substantially flush with that of the plate.

In the semiconductor power module according to the present invention, the spacer has elasticity and the surface of the spacer is substantially flush with that of the plate provided on the power substrate, whereby it is possible to effectively bring the plate into pressure contact with an external heat slinger or the like with a sufficient pressure. Since the spacer has elasticity, further, no high accuracy is required for the dimensions of the power substrate etc. which is in contact therewith.

Preferably, the spacer has elasticity, and a lower major surface of the spacer projects downwardly beyond that of the plate.

In the semiconductor power module according to the present invention, the spacer has elasticity and its surface projects outwardly beyond that of the plate provided on the power substrate, whereby the spacer functions as a packing when the unit is mounted on an external heat slinger or the like. Thus, the power switching semiconductor element is protected against the outside air, whereby the semiconductor element is effectively suppressed from deterioration caused by moisture contained in the outside air or the like. Since the spacer has elasticity, further, no high accuracy is required for the dimensions of the power substrate etc. which is in contact therewith.

Preferably, a lower major surface of the plate projects downwardly beyond that of the spacer.

In the semiconductor power module according to the present invention, the surface of the plate provided on the power substrate is positioned outwardly beyond that of the spacer, whereby it is possible to effectively bring the plate into pressure contact with an external heat slinger or the like with a sufficient pressure.

Preferably, the power substrate further comprises a contact member which is arranged on an upper edge of the upper major surface of the power substrate body to be in contact with the control substrate, and the contact member substantially consists of a metal.

In the semiconductor power module according to the present invention, the power substrate is in contact with the control substrate in the contact member, whereby the contact member so functions as a cushioning material that it is possible to prevent the power substrate body from breakage caused by engagement with the control substrate. Further, strength of the power substrate body is improved.

Preferably, the pressing member comprises a metal plate.

In the semiconductor power module according to the present invention, the pressing member comprises the metal plate, whereby it is possible to bring the plate which is exposed on the outer surface of the housing into pressure contact with an external heat slinger or the like with a further sufficient pressure. Further, the metal plate screens electromagnetic wave noise generated following an operation of the control circuit element, thereby inhibiting leakage of the noise toward the exterior of the unit.

Preferably, the control substrate is provided with an opening passing through a central portion of its major surface, and the power substrate is positioned in the opening.

In the semiconductor power module according to the present invention, the control substrate has the opening so that the power substrate is positioned in this opening, whereby the bottom surface portion of the housing is further reduced in size to further miniaturize the unit.

Preferably, an upper major surface of the power substrate positioned in the opening is located downward beyond that of the control substrate, and precoating resin is provided in the opening for covering the power switching element.

The semiconductor power module according to the present invention comprises the precoating resin covering the power switching element, whereby the switching element is reliably protected against moisture. Thus, the withstand voltage of the switching element is maintained for a long time. Further, a step is defined between the major surfaces of the power substrate and the control substrate, so that the switching element to be covered with the precoating resin is arranged on a retracted surface of this step. In a process of covering the switching element with the precoating resin, therefore, this step inhibits the precoating resin from flowing out, whereby steps of fabricating the semiconductor power module are simplified and the precoating resin is not consumed in an excess amount.

Preferably, the inner peripheral edge of the spacer is in contact with the outer peripheral edge of the power substrate through a flexible adhesive.

In the semiconductor power module according to the present invention, the power substrate and the spacer are in contact with each other through the flexible adhesive, whereby the power substrate is prevented from deformation caused by a difference in thermal expansion coefficient between the power substrate and the spacer.

Preferably, an upper major surface of the spacer is in contact with the lower major surface of the control substrate, and the spacer and the control substrate are fixed to each other.

In the semiconductor power module according to the present invention, the major surfaces of the control substrate forming the bottom surface portion of the housing and the spacer are in contact with/fixed to each other. Thus, the bottom surface portion can be reduced in thickness, while the spacer is prevented from droppage.

Preferably, the spacer and the control substrate are fixed to each other by an adhesive.

Preferably, the spacer and the control substrate are fixed to each other through a screw.

Preferably, the semiconductor power module further comprises a thermally conductive plate-type heat-conducting plate which is provided to be in contact with a lower portion of the bottom portion of the housing, and the heat-conducting plate has an upper major surface which is slidable along a lower major surface of the plate.

In the semiconductor power module according to the present invention, the thermally conductive heat-conducting plate is slidably in contact with the plate of the power substrate. Thus, heat loss which is generated in the circuit is dissipated toward an external heat slinger through the heat-conducting plate, whereby the heat loss is effectively dissipated also when the heat slinger is inferior in surface smoothness.

Preferably, the heat-conducting plate is fixed to the spacer.

Preferably, the upper major surface of the heat-conducting plate is mounted on the lower major surface of the plate through a flexible adhesive.

The present invention is also directed to a method of fabricating a semiconductor power module. According to the present invention, the method of fabricating a semiconductor power module comprises (a) a step of obtaining a substrate structural body comprising a power substrate which is provided with an electrically conductive power interconnection pattern arranged on an upper major surface of a power substrate body having a heat-resistant insulating material and a thermally conductive plate, having a material which is substantially identical to that of the power interconnection pattern, which is provided on a lower major surface of the power substrate body, (b) a step of connecting a power switching semiconductor element to the power interconnection pattern, and (c) a step of coupling a bottomless case to the substrate structural body thereby preparing a housing having the power substrate as a part of its bottom portion and storing the power switching semiconductor element in its interior, and the step (c) comprises (c-1) a step of coupling the case to the power substrate to expose a lower major surface of the plate on the bottom portion of the housing.

According to the inventive method of fabricating a semiconductor power module, it is possible to readily fabricate the semiconductor power module according to the present invention.

Preferably, the step (c-1) comprises a step of bonding the substrate structural body with the case by adhesion.

Preferably, the method of fabricating a semiconductor power module further comprises (d) a step of preparing a control substrate by arranging an electrically conductive control interconnection pattern on an upper major surface of a control substrate body substantially consisting of an insulator and layering a plate-type pressing member having rigidity on a lower major surface of the control substrate body, and (e) a step of connecting a control circuit element to the control interconnection pattern, and the step (c) comprises (c-2) a step of engaging the control substrate with an edge of the power substrate while arranging the former around the latter.

Preferably, the method of fabricating a semiconductor power module further comprises (f) a step of preparing a plate-type spacer having an inner peripheral edge, and the step (c) further comprises (c-3) a step of arranging the spacer around the power substrate so that the inner peripheral edge is in contact with an outer peripheral edge of the power substrate.

Preferably, the spacer has elasticity, and the step (c-3) comprises (c-3-1) a step of arranging the spacer so that a lower major surface of the spacer is substantially flush with that of the plate.

Preferably, the step (c-3) comprises (c-3-2) a step of arranging the spacer so that a lower major surface of the spacer is positioned downwardly beyond that of the plate.

Preferably, the step (c-3) comprises (c-3-3) a step of bringing the inner peripheral edge of the spacer into contact with the outer peripheral edge of the power substrate through a flexible adhesive.

Preferably, the step (c-3) comprises (c-3-4) a step of bringing a lower major surface of the spacer into contact with that of the control substrate while fixing the spacer and the control substrate to each other.

Preferably, the step (c-3-4) comprises a step of fixing the spacer and the control substrate to each other by inserting an adhesive therebetween.

Preferably, the step (c-3-4) comprises a step of fixing the spacer and the control substrate to each other through a screw.

Preferably, the method of fabricating a semiconductor power module further comprises (g) a step of arranging a thermally conductive plate-type heat-conducting plate so that its upper major surface is slidably in contact with a lower major surface of the plate.

Preferably, the step (g) comprises (g-1) a step of arranging the heat-conducting plate so that its upper major surface is slidably in contact with the lower major surface of the plate by fixing the same to the spacer.

Preferably, the step (g) comprises (g-2) a step of attaching the upper major surface of the heat-conducting plate to the lower major surface of the plate through a flexible adhesive.

Accordingly, an object of the present invention is to obtain a semiconductor power module of a simple structure causing no breaking of a power substrate, which can be fabricated at a low cost for implementing speed increase and miniaturization, and a method which is suitable for fabricating this unit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
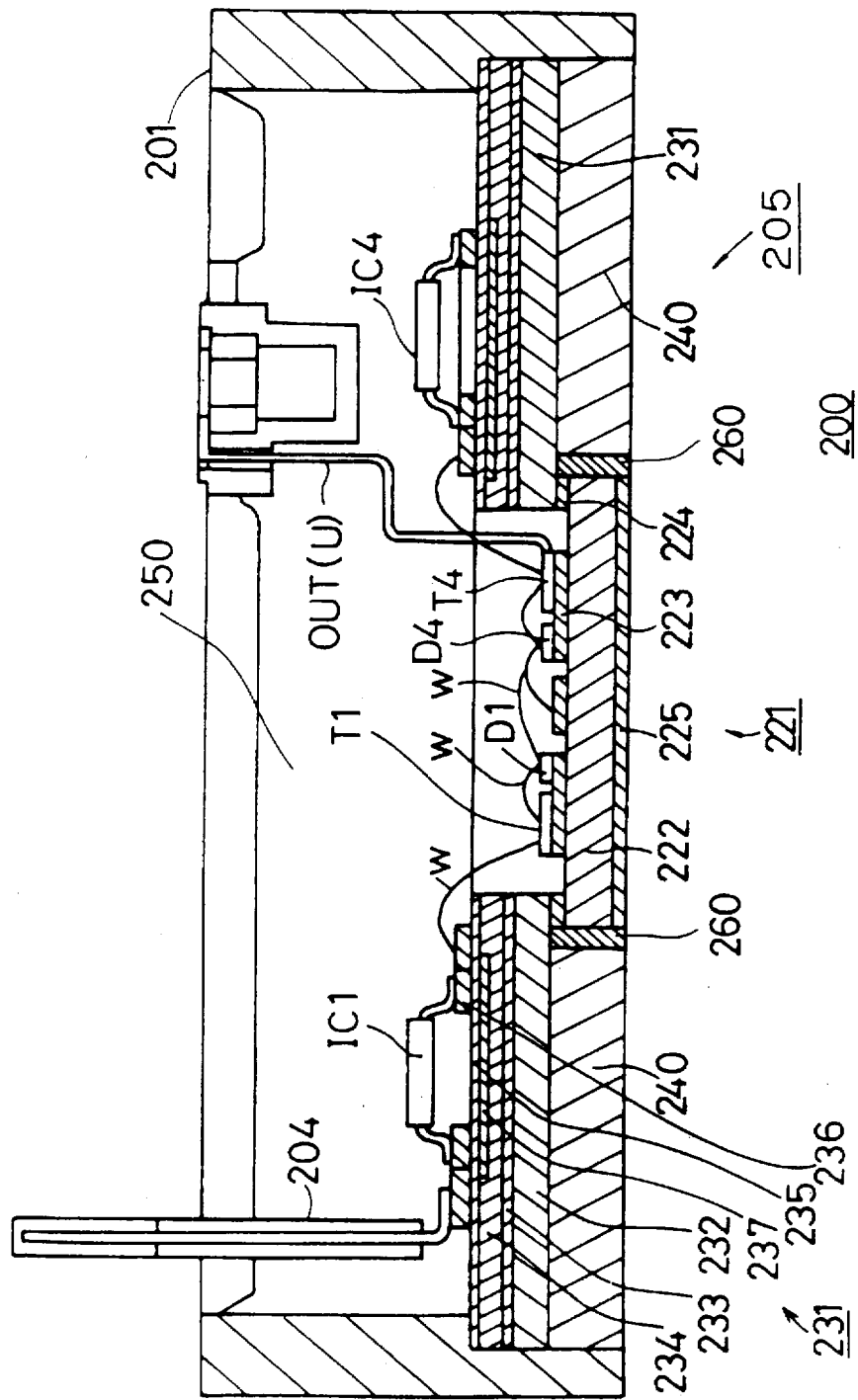
FIG. 1 is a front sectional view of a unit according to an embodiment of the present invention.

The present invention is now described with reference to embodiments thereof. In the accompanying drawings, portions identical to those of the conventional unit are denoted by the same reference numerals, to omit redundant description.

[Embodiment 1]

<Circuit Structure and Operation of Unit>

Figure 2:
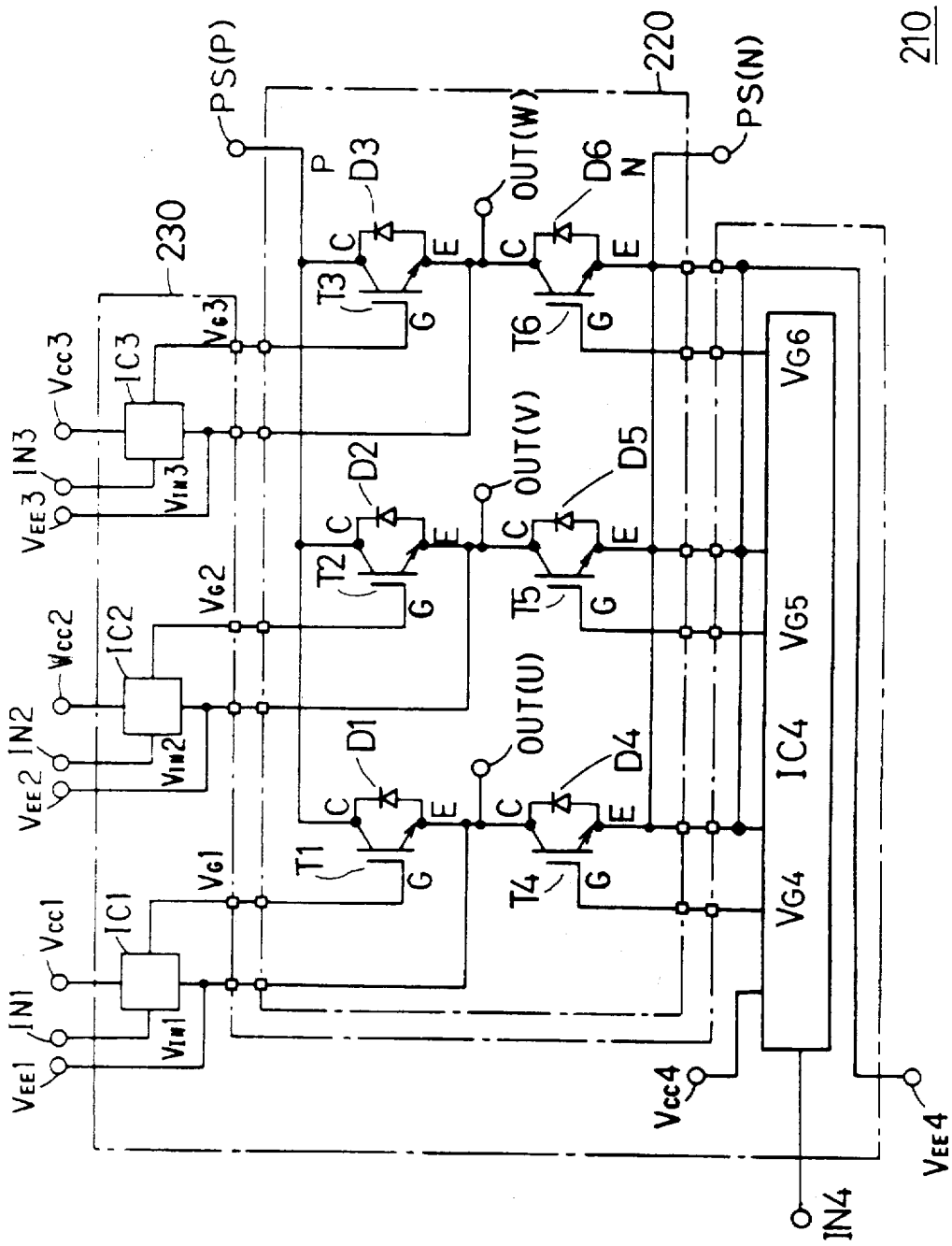
FIG. 2 is a schematic circuit diagram showing a circuit part of the unit according to the embodiment of the present invention.

FIG. 2 is a schematic circuit diagram showing a principal portion of a circuit 210 of a semiconductor power module 200 according to a first embodiment of the present invention. The circuit 210 of the unit 200 has a main circuit 220 for supplying adjusted power to a load, and a control circuit 230 for controlling the operation of the main circuit 220. Six IGBT elements (power switching semiconductor elements) T1 to T6 provided on the main circuit 220 repetitively cut off or connect currents to be supplied to the load in response to gate voltage signals (control signals) VG1 to VG6 which are outputted from four semiconductor elements (control circuit elements) IC1 to IC4 provided on the control circuit 230.

Three IGBT elements T3 to T6, having common negative power supply potentials, are supplied with the gate voltage signals VG4 to VG6 by one common semiconductor element IC4.

The main circuit 220, which is fed with a relatively large current, is subjected to circuit design to be resistant against a high current and heat generation following the high current, similarly to the conventional unit. On the other hand, the control circuit 230, which is adapted to process voltage signals, is fed with a small current. Thus, the control circuit 230 is not subjected to circuit design to cope with a high current.

<Appearance of Unit>

Figure 3:
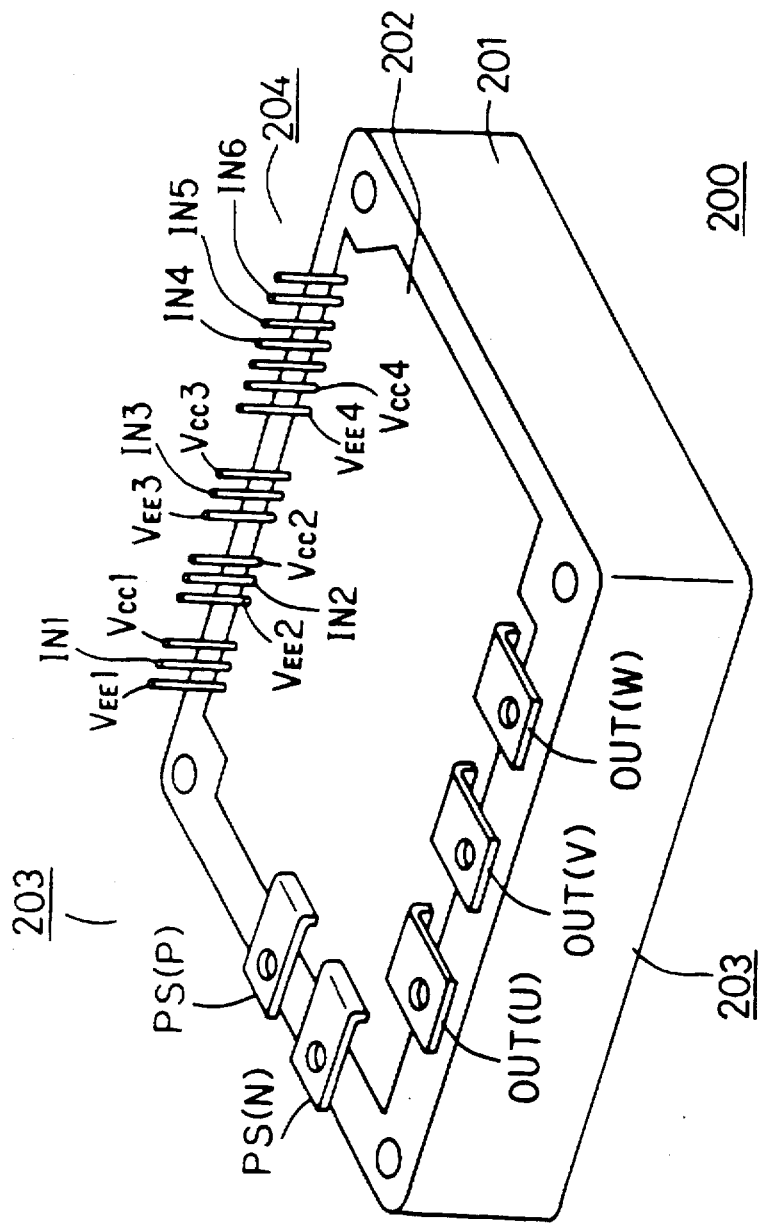
FIG. 3 is a perspective view showing the appearance of the unit according to the embodiment of the present invention.

FIG. 3 is a perspective view showing the appearance of the unit 200. The unit 200 comprises a case 201 which is made of an insulator such as synthetic resin. Terminals 203 and 204 of the main circuit 220 and the control circuit 230 are exposed toward the exterior of an upper surface of a body part. Referring to these terminals 203 and 204, those identical to those in the circuit diagram shown in FIG. 2 are denoted by the same symbols.

<Arrangement of Circuit Elements of Main Circuit>

Figure 4:
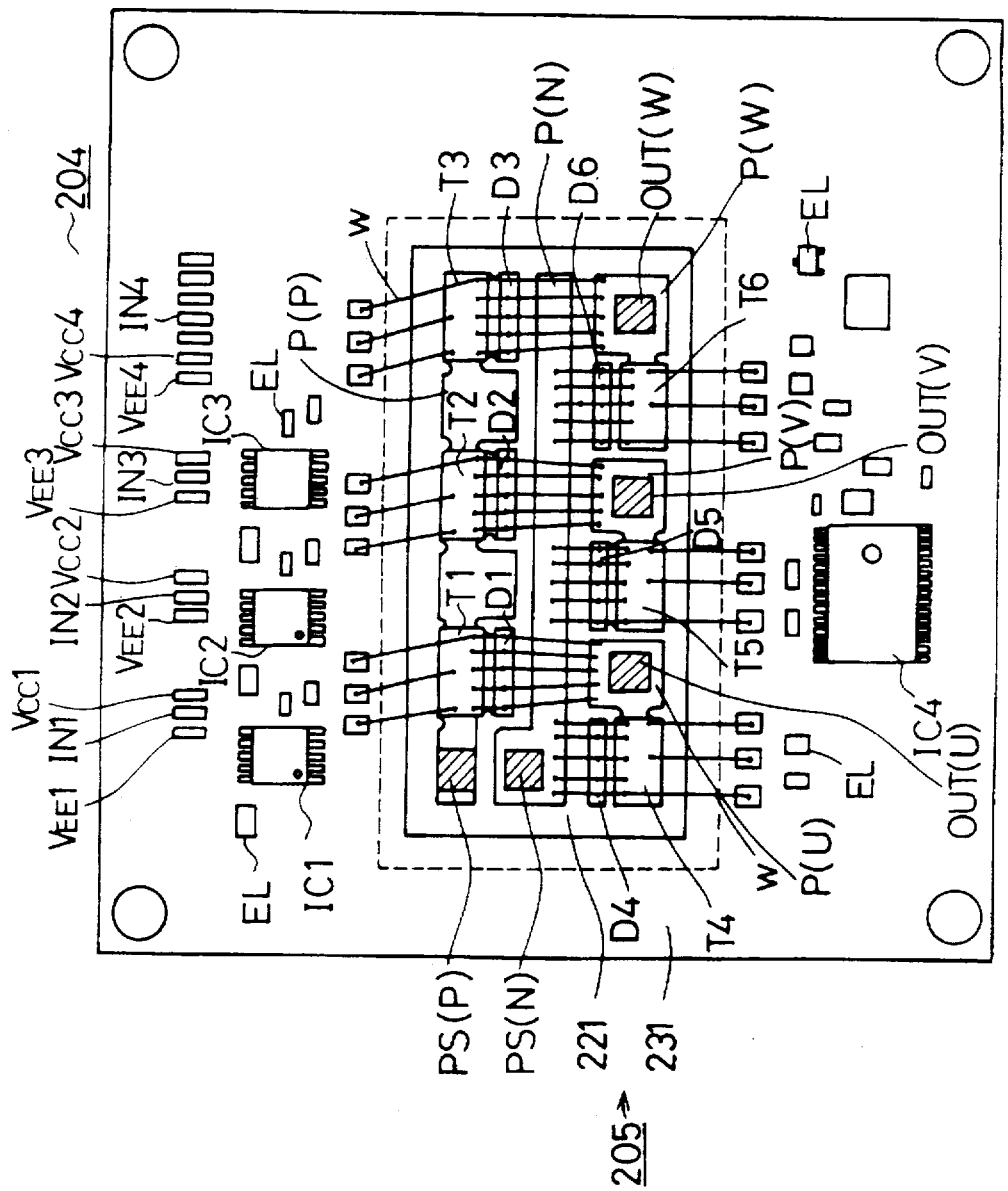
FIG. 4 is a plan view showing a composite substrate and circuit elements arranged thereon in the embodiment of the present invention.

FIG. 4 is a plan view showing a composite substrate 205 forming a box member (housing) of the unit 200 with the case 201, and circuit elements which are arranged thereon. The composite substrate 205 has a power substrate 221 developing the main circuit 220, and a control substrate 231 developing the control circuit 230. The control substrate 231 is provided with passive circuit elements EL, in addition to the semiconductor elements IC1 to IC4. The respective circuit elements and the terminals are properly connected with each other by conductor wires w.

<Structure of Power Substrate>

Figure 5A:
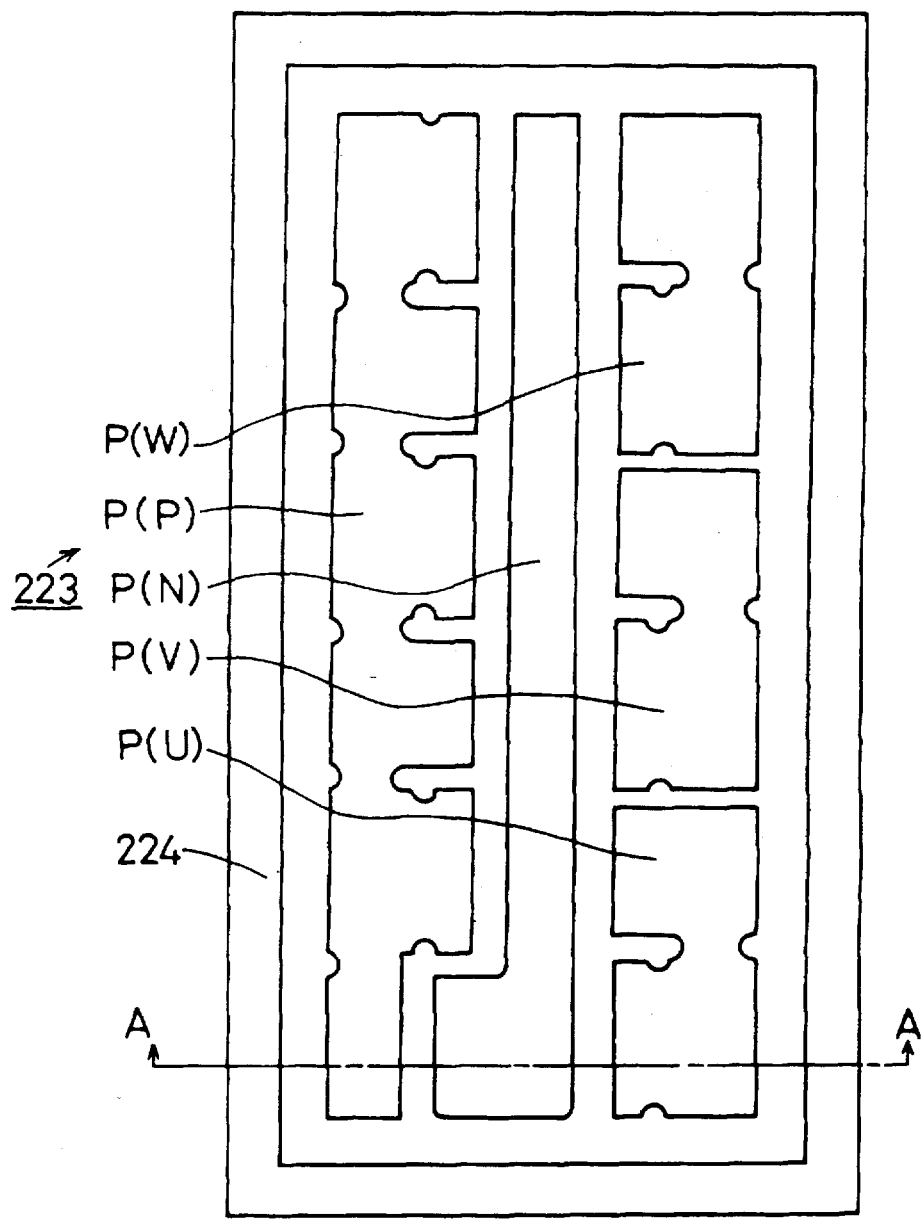
FIGS. 5A and 5B are structural diagrams showing a power substrate in the embodiment of the present invention.
Figure 5B:
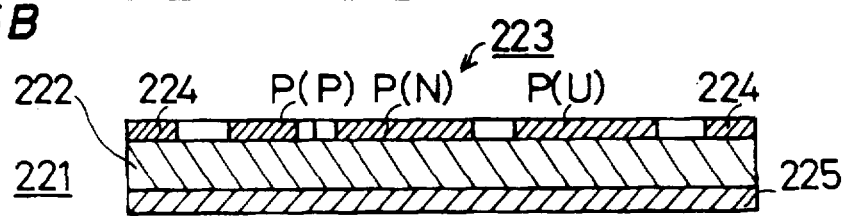

FIGS. 5A and 5B are a plan view of the power substrate 221 and a sectional view taken along the line A—A in FIG. 5A respectively. The power substrate 221 has the structure of a DBC substrate. Namely, the power substrate 221 comprises a plate-type power substrate body 222 made of aluminum oxide or aluminum nitride having excellent heat resistance, heat conductivity and mechanical strength, which is provided on its surface (first major surface) with flat plate type patterns (power interconnection patterns) 223 and 224 mainly consisting of copper. Surfaces of the patterns 223 and 224 are plated with nickel or the like, for example. These patterns 223 and 224 are metallization-bonded to the power substrate body 222.

The pattern 223, which is an interconnection pattern connected with the IGBT elements T1 to T6, the circuit elements D1 to D6 and the like, has five portions including interconnection patterns P(P), P(N), P(U), P(V) and P(W). As shown in FIG. 4, the interconnection patterns P(P) and P(N) are connected to power supply terminals PS(P) and PS(N) respectively, to transmit source potentials. The interconnection patterns P(U), P(V) and P(W) are connected to output terminals OUT(U), OUT(V) and OUT(W) respectively, to transmit load currents. The pattern 224, which is identical in material and thickness to the pattern 223, is arranged along edge portions of the power substrate 221 in particular. The power substrate 221 is engaged with the control substrate 231 on a major surface of the pattern 224, as described later.

A flat plate type pattern (plate) 225 which is identical in material to the patterns 223 and 224 is provided on the overall rear surface (second major surface) of the power substrate 221 by metallization bonding. The thickness of the power substrate body 222 is decided in consideration of required mechanical strength and heat radiation property, while those of the patterns 223, 224 and 225 are decided in correspondence to the ratio of an area covered with the patterns 223 and 224 to the overall area of the power substrate body 222, so that the power substrate 221 itself is not warped following its temperature change.

<Structure of Control Substrate>

FIG. 1 is a front sectional view showing the unit 200. The control substrate 231 has the structure of an insulating metal substrate. Namely, the control substrate 231 has a metal plate (pressing member) 232 of iron or aluminum, and a coating (insulating layer) 233 of epoxy resin, which is an insulating material, provided on one major surface of the metal plate 232. Further, a control substrate body 235 of epoxy resin reinforced with glass fiber (GFRP), which is provided on both major surfaces with interconnection patterns (control interconnection patterns) 236 and 237 mainly consisting of copper respectively, is attached onto the surface of the coating 233 through an adhesive 234. The control substrate 231 is provided in its central portion with an opening having an inner periphery which is slightly smaller than the outer periphery of the power substrate 221, to be arranged around the power substrate 221 in engagement with the pattern 224 thereof.

<Structure of Spacer>

A plate type spacer 240 provided with an opening having an inner periphery which is in coincidence with or slightly larger than the outer periphery of the power substrate 221 is provided along the periphery of the power substrate 221. The spacer 240 is made of resin such as epoxy resin which is excellent in heat resistance, or a metal. Major surfaces of the spacer 240 and the control substrate 231 are in contact with each other, and bonded to each other by an adhesive. Further, an inner peripheral edge of the spacer 240 and an outer peripheral edge of the power substrate 221 which are in contact with each other are bonded to each other by a flexible adhesive 260 of silicone, for example. Lower surfaces of the pattern 225 and the spacer 240 are flush with each other.

<Structure of Housing>

Figure 6:
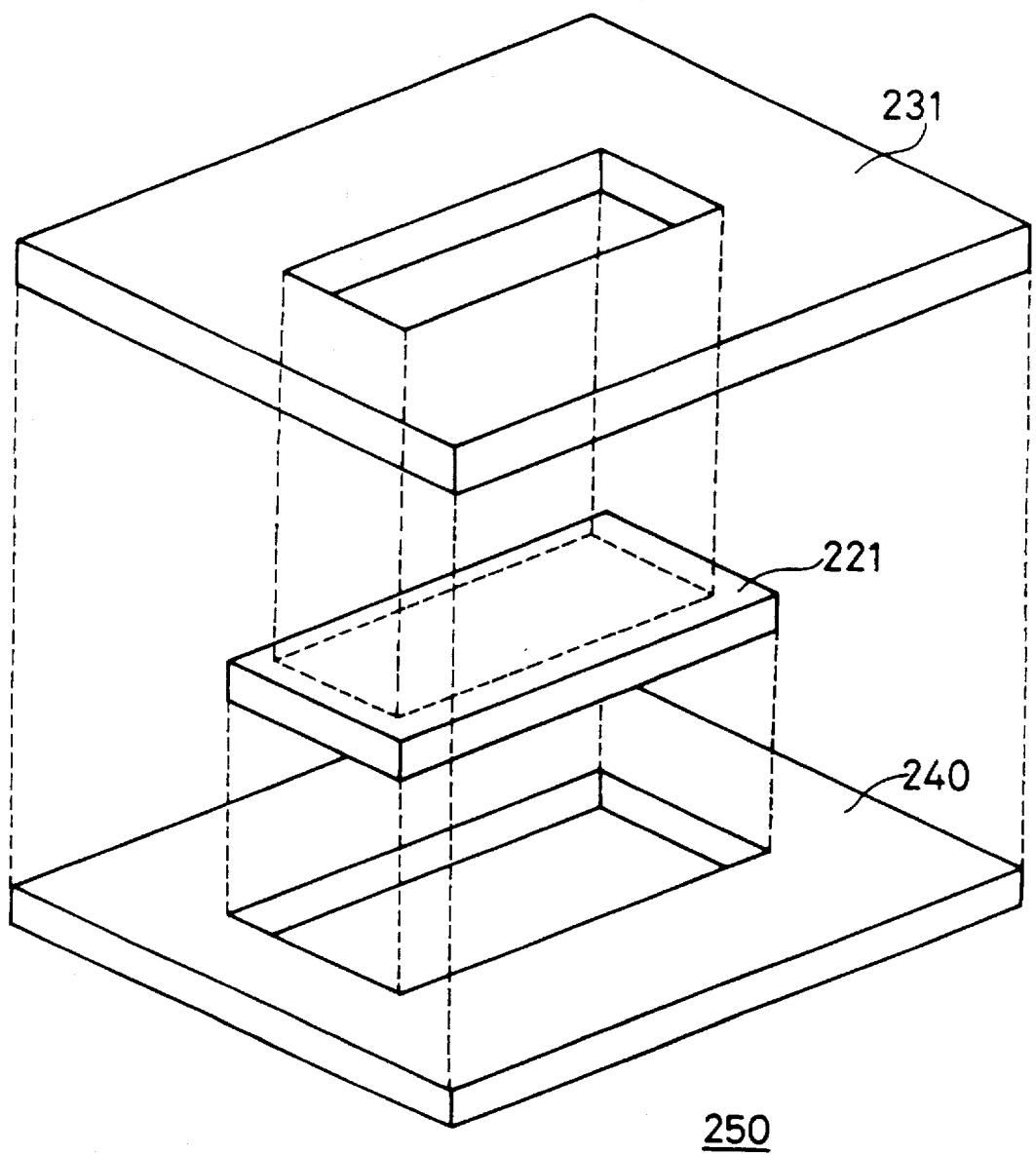
FIG. 6 is an exploded perspective view showing the composite substrate in the embodiment of the present invention.

The power substrate 221, the control substrate 231 and the spacer 240 form the composite substrate 205. FIG. 6 is an exploded perspective view of the composite substrate 205, typically illustrating positional relations between the power substrate 221, the control substrate 231 and the spacer 240.

Referring again to FIG. 1, the composite substrate 205 forms a bottom surface of the unit 200, and structures a housing storing the circuit elements such as the IGBT elements T1 to T6 and the semiconductor elements IC1 to IC4 in its internal space with the case 201 having an opening upper end. The case 201 itself is bottomless, and hence a bottom portion of the housing is formed by the composite substrate 205. This composite substrate 205 is fixed to the case 201 by an adhesive. The internal space of the housing is filled up with a filler 250 of epoxy resin, in order to protect the circuit elements. A cover may be provided on the upper surface of the unit 200, similarly to the cover 102 in the conventional unit 100.

<Function of Unit>

In this unit 200, the pattern 225 provided on the bottom surface of the power substrate 221 is exposed on an outer surface of the housing. Therefore, it is possible to effectively discharge heat which is generated in the main circuit 220 to the exterior without providing a copper base plate, by mounting the unit 200 so that the pattern 225 is directly in contact with an external heat slinger (not shown). The control substrate 231 is engaged with the power substrate 221 in the pattern 224 and comprises the metal plate 232, whereby the pattern 225 of the power substrate 221 is brought into pressure contact with the heat slinger with a considerable pressure when the case 201 or the like is fixed to the heat slinger through a screw or the like. Namely, pressing force toward the heat slinger is effectively transmitted from the case 201 to the power substrate 221 through the metal plate 232 having rigidity and functioning as a pressing member. Thus, the pattern 225 is in excellent heat contact with the heat slinger, whereby the heat is effectively discharged.

The unit 200 requires no copper base plate, whereby no bimetal effect is caused following temperature change. Thus, the power substrate 221 will not be broken. Further, this unit 200 requires no S-bent structures, which have been required in the conventional unit, whereby a high-speed operation of the unit 200 is enabled. Since the power substrate 221 is not deformed by a bimetal effect and requires no S-bent structures, it is possible to fill up the internal space of the housing with only epoxy resin without filling silicone gel around the circuit elements.

The unit 200 is provided with the spacer 240 having the opening which is in contact with the outer edge of the power substrate 221, whereby the power substrate 221 stored in the opening of the spacer 240 is regularly located at a prescribed position. Further, the power substrate 221 and the spacer 240 are in contact with each other through the flexible adhesive 260, whereby it is possible to prevent occurrence of internal distortion and deformation caused by a difference in thermal expansion coefficient between the power substrate 221 and the spacer 240, for regularly maintaining the pattern 225 and the heat slinger in excellent heat contact with each other. In addition, the major surfaces of the control substrate 231 and the spacer 240 are in contact with each other, and fixed to each other by an adhesive. Thus, the composite substrate 205 can be reduced in thickness, while the spacer 240 is prevented from droppage. Adhesion between the case 201 and the composite substrate 205 prevents the overall composite substrate 205 from droppage from the case 201. Further, the control substrate 231 is arranged around the power substrate 221, whereby the unit 200 can be reduced in thickness to be miniaturized.

[Embodiment 2]

In the unit 200 according to the first embodiment, the spacer 240 can alternatively be made of resin such as silicone resin having heat resistance as well as elasticity. In this case, the adhesive 260 may alternatively be hard and the inner peripheral edge of the opening of the spacer 240 may not be larger than the outer peripheral edge of the power substrate 221. Since the spacer 240 has elasticity, the pattern 225 of the power substrate 221 is further effectively brought into pressure contact with the heat slinger when the case 201 or the like is fixed to the heat slinger by a screw or the like. According to this embodiment, it is possible to attain a heat radiation effect which is superior to that of the unit 200 according to the first embodiment.

[Embodiment 3]

Figure 7:
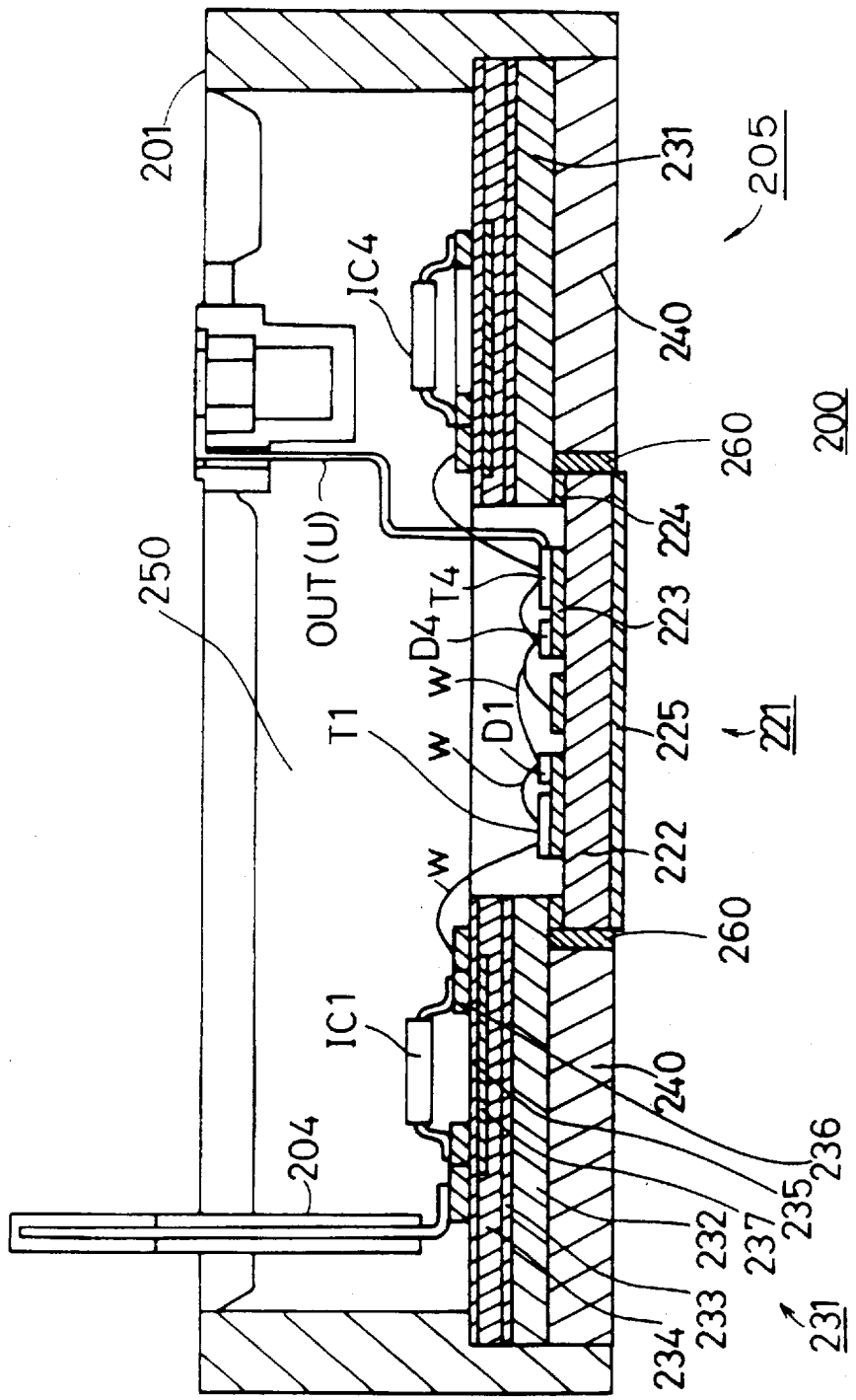
FIG. 7 is a front sectional view of a unit according to another embodiment of the present invention.

FIG. 7 is a front sectional view showing a unit according to a third embodiment of the present invention. In the unit according to this embodiment, a surface of a pattern 225 of a power substrate 221 slightly projects beyond that of a spacer 240 in a structure similar to that of the unit 200 according to the first embodiment. When a case 201 or the like is fixed to a heat slinger by a screw or the like, therefore, the pattern 225 is further effectively brought into contact with the heat slinger. In the unit according to this embodiment, it is possible to attain a heat radiation effect which is superior to that of the unit 200 according to the first embodiment.

[Embodiment 4]

Figure 8:
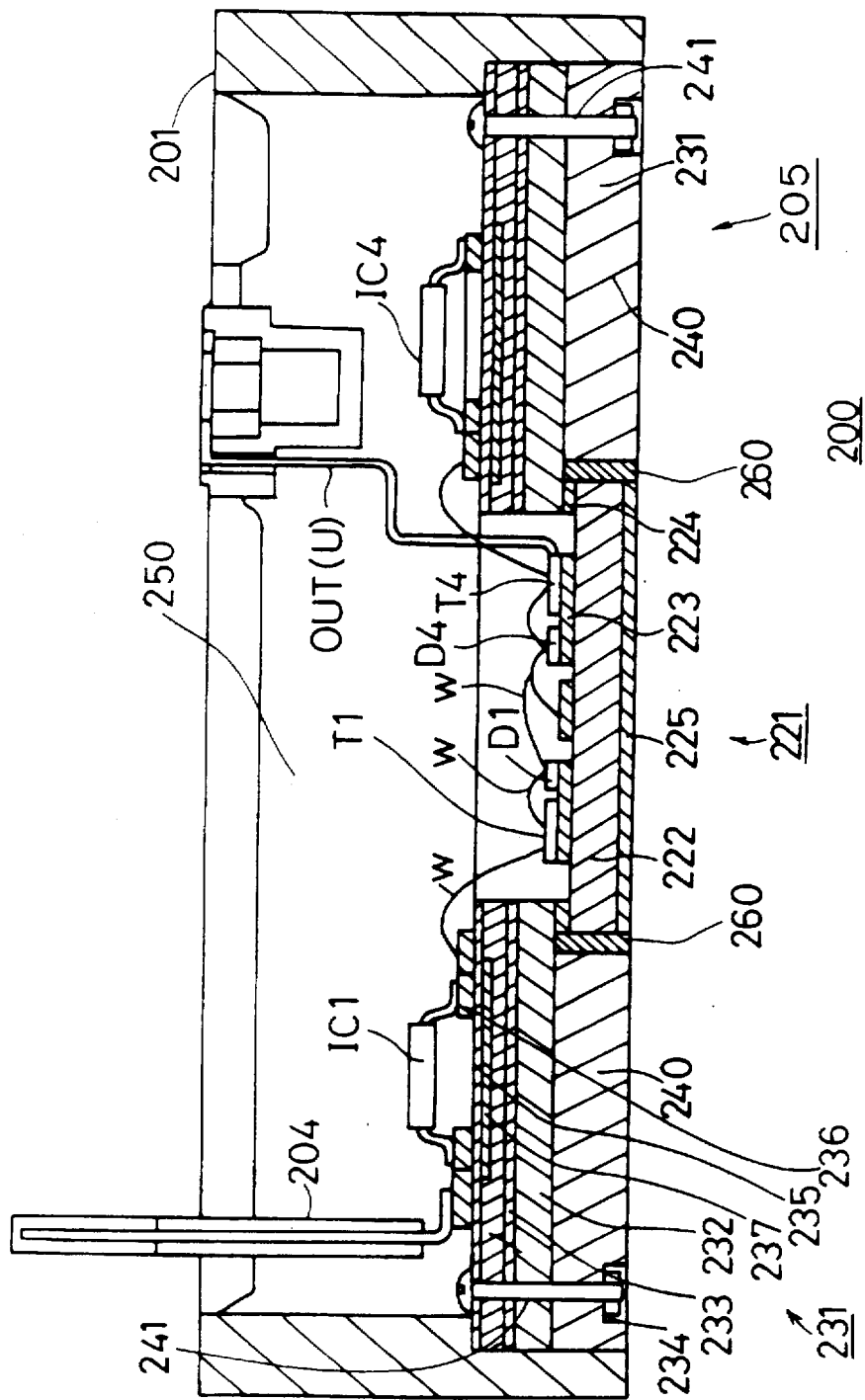
FIG. 8 is front sectional view of a unit according to still another embodiment of the present invention.

FIG. 8 is a front sectional view showing a unit according to a fourth embodiment of the present invention. In the unit according to this embodiment, a control substrate 231 and a spacer 240 are not bonded to each other by an adhesive but fastened to each other by a screw 241, in a structure similar to that of the unit 200 according to the first embodiment. Thus, it is possible to prevent the spacer 240 from droppage, similarly to the unit 200 according to the first embodiment.

[Embodiment 5]

Figure 9:
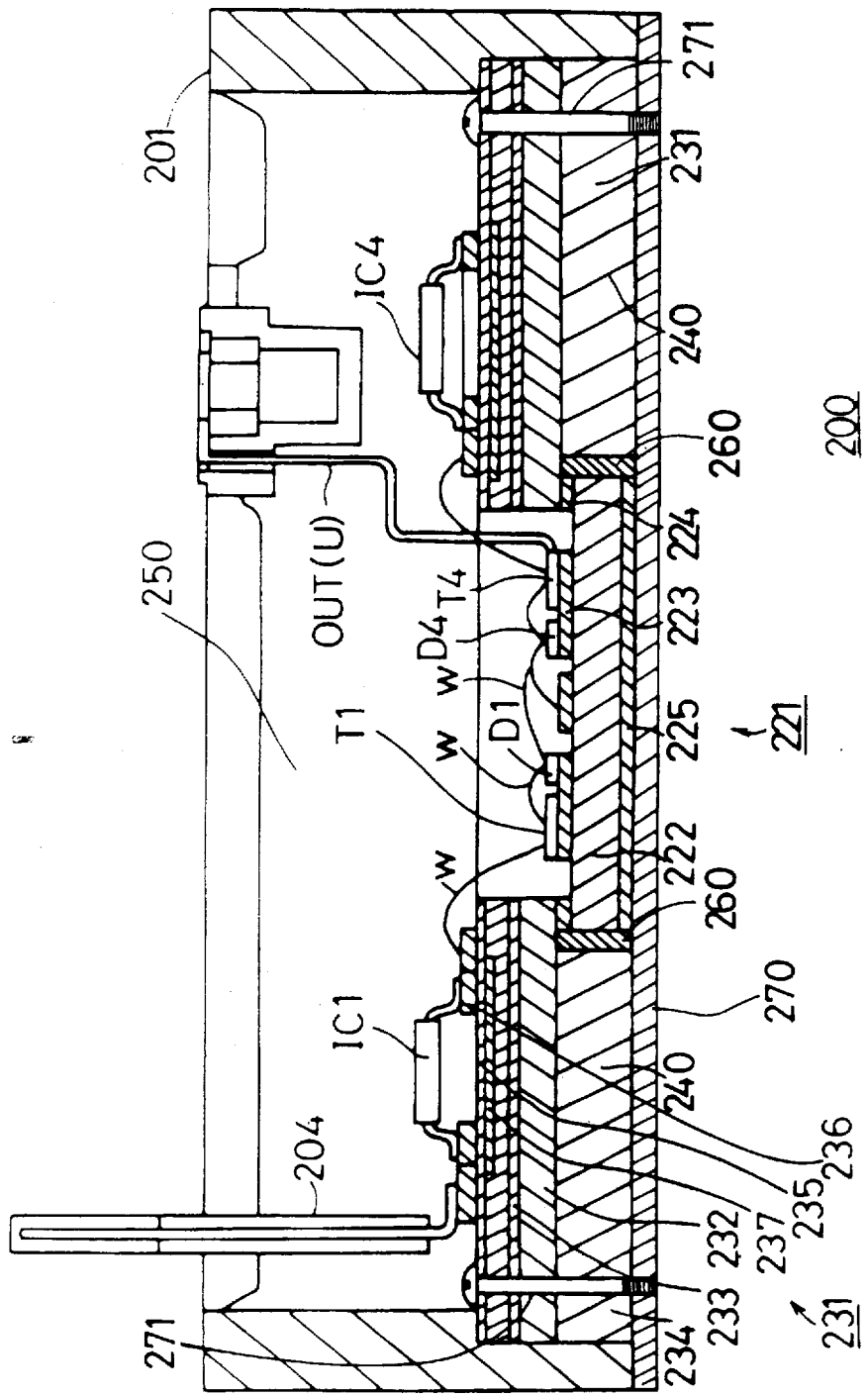
FIG. 9 is a front sectional view of a unit according to a further embodiment of the present invention.

FIG. 9 is a front sectional view showing a unit 200 according to a fifth embodiment of the present invention. In the unit 200 according to this embodiment, a thermally conductive heat-conducting plate 270 of copper or aluminum is provided on a bottom surface of a housing. The heat-conducting plate 270 is fastened to a spacer 240 by a screw 271. An upper surface of the heat-conducting plate 270 is in contact with a bottom surface of a pattern 225. In employment of the unit 200, a case 201 or the like is fixed to a heat slinger (not shown) which is provided in the exterior of the unit 200 by a screw or the like, so that a bottom surface of the heat-conducting plate 270 is brought into pressure contact with the heat slinger. Thus, heat loss which is generated in a main circuit 220 is transmitted from the pattern 225 to the heat-conducting plate 270, and further dissipated toward the external heat slinger.

It is possible to maintain the pattern 225 and the heat-conducting plate 270 in excellent heat contact by improving the upper surface of the heat-conducting plate 270 in surface smoothness similarly to the bottom surface of the pattern 225. Thus, heat which is generated in the main circuit 220 is effectively transmitted to the heat-conducting plate 270 having a relatively wide surface area. Namely, the heat-conducting plate 270 itself functions as a miniature heat slinger. Even if the heat slinger which is in pressure contact with the bottom surface of the heat-conducting plate 270 is inferior in surface smoothness and these members are inferior in heat contact with each other, therefore, it is possible to dissipate the heat generated in the main circuit 220 to the heat slinger with no problem. Namely, it is not necessary to strictly select the type of the heat slinger to be provided in the exterior, due to provision of the heat-conducting plate 270.

While the heat-conducting plate 270 and the pattern 225 are in heat contact with each other, these members are slidable along the contact surfaces. Thus, no deformation of a power substrate 221 is caused following its temperature change, dissimilarly to the conventional unit 100.

The heat slinger 270 may be attached to the bottom surface of the power substrate 221 or the spacer 240, or both of these bottom surfaces through an adhesive, in place of being fastened to the spacer 240 through the screw 271. When the heat-conducting plate 270 is attached to the bottom surface of the power substrate 221, the adhesive is prepared from a flexible one. Thus, the upper surface of the heat-conducting plate 270 and the bottom surface of the power substrate 221 are slidable along these surfaces, whereby the power substrate 221 is prevented from thermal deformation.

[Embodiment 6]

Figure 10:
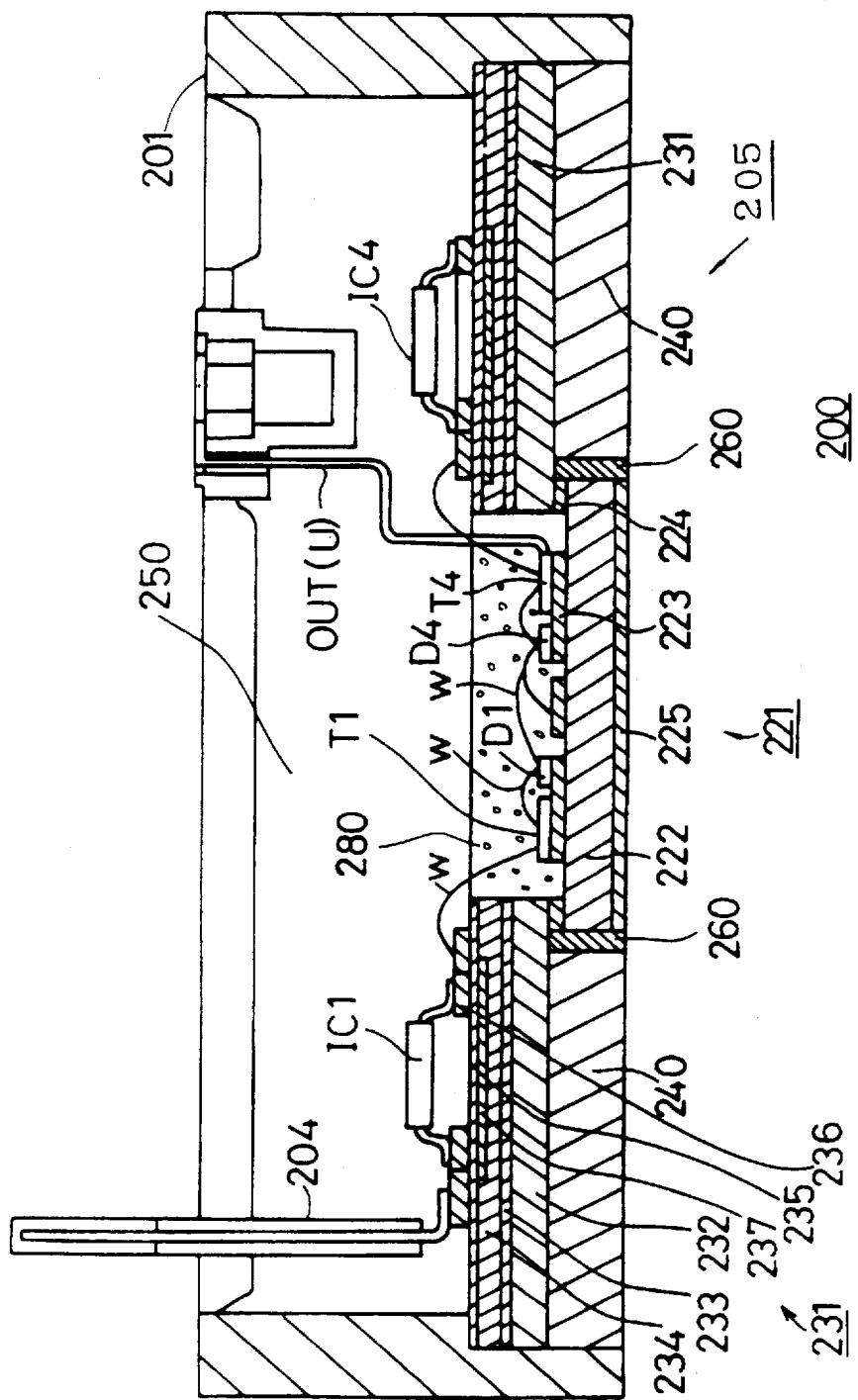
FIG. 10 is a front sectional view of a unit according to a further embodiment of the present invention.

FIG. 10 is a front sectional view showing a unit according to a sixth embodiment of the present invention. In the unit of this embodiment, an upper major surface of a power substrate 221 is coated with precoating resin 280 in a structure similar to that of the unit 200 according to the first embodiment. The precoating resin 280 covers circuit elements such as IGBT elements T1 to T6 and circuit elements D1 to D6 to protect these circuit elements against moisture, thereby preventing the same from deterioration in withstand voltage. The precoating resin 280, which is mainly adapted to prevent insulation deterioration, must be prepared from a material having high purity such as high-purity epoxy resin, for example. Alternatively, the precoating resin 280 may be prepared from high-purity epoxy resin containing powder of alumina or silica. In this case, it is possible to coincide the thermal expansion coefficient of the precoating resin 280 with that of the power substrate 221 by adjusting the content of the powder, whereby the precoating resin 280 is hard to separate and the life of the unit is improved.

Since the material for the precoating resin 280 is high-priced, it is preferable to avoid wasteful use. As shown in FIG. 10, a step is defined between upper major surfaces of the power substrate 221 and a control substrate 231 in the unit according to this embodiment, so that the upper major surface of the power substrate 221 is downwardly retracted beyond that of the control substrate 231. Thus, the precoating resin 280 which is applied to the upper major surface of the power substrate 221 is prevented from flowing out from an opening of the control substrate 231 in a fluid state before hardening. Consequently, the high-priced precoating resin 280 is not unnecessarily diffused and not consumed in vain. It is not necessarily required to fill up the opening of the control substrate 231 with the precoating resin 280 up to its upper end, but the circuit elements such as the IGBT elements T1 to T6 may be sufficiently covered with the same.

[Embodiment 7]

Figure 11:
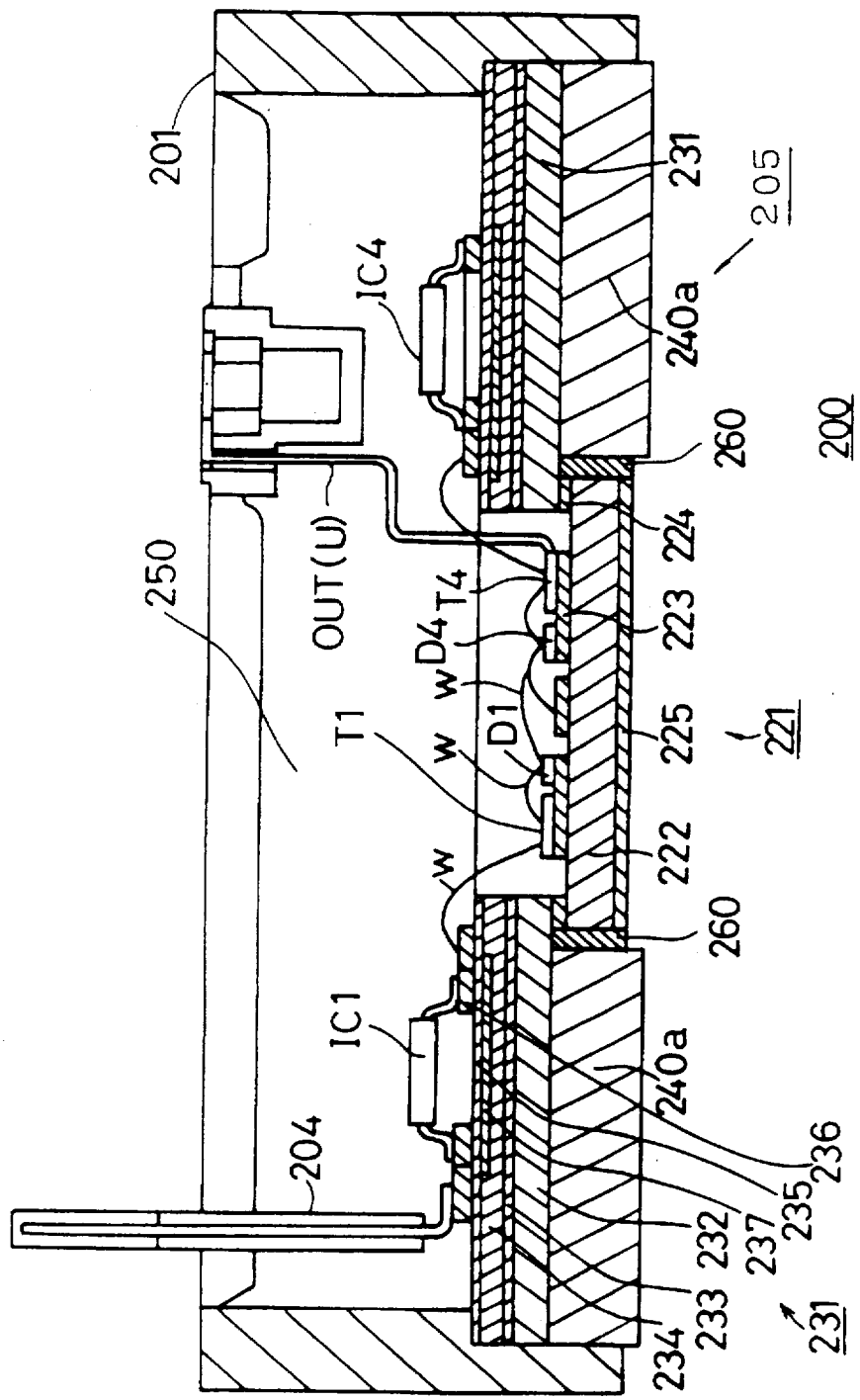
FIG. 11 is a front sectional view of a unit according to a further embodiment of the present invention.
Figure 12:
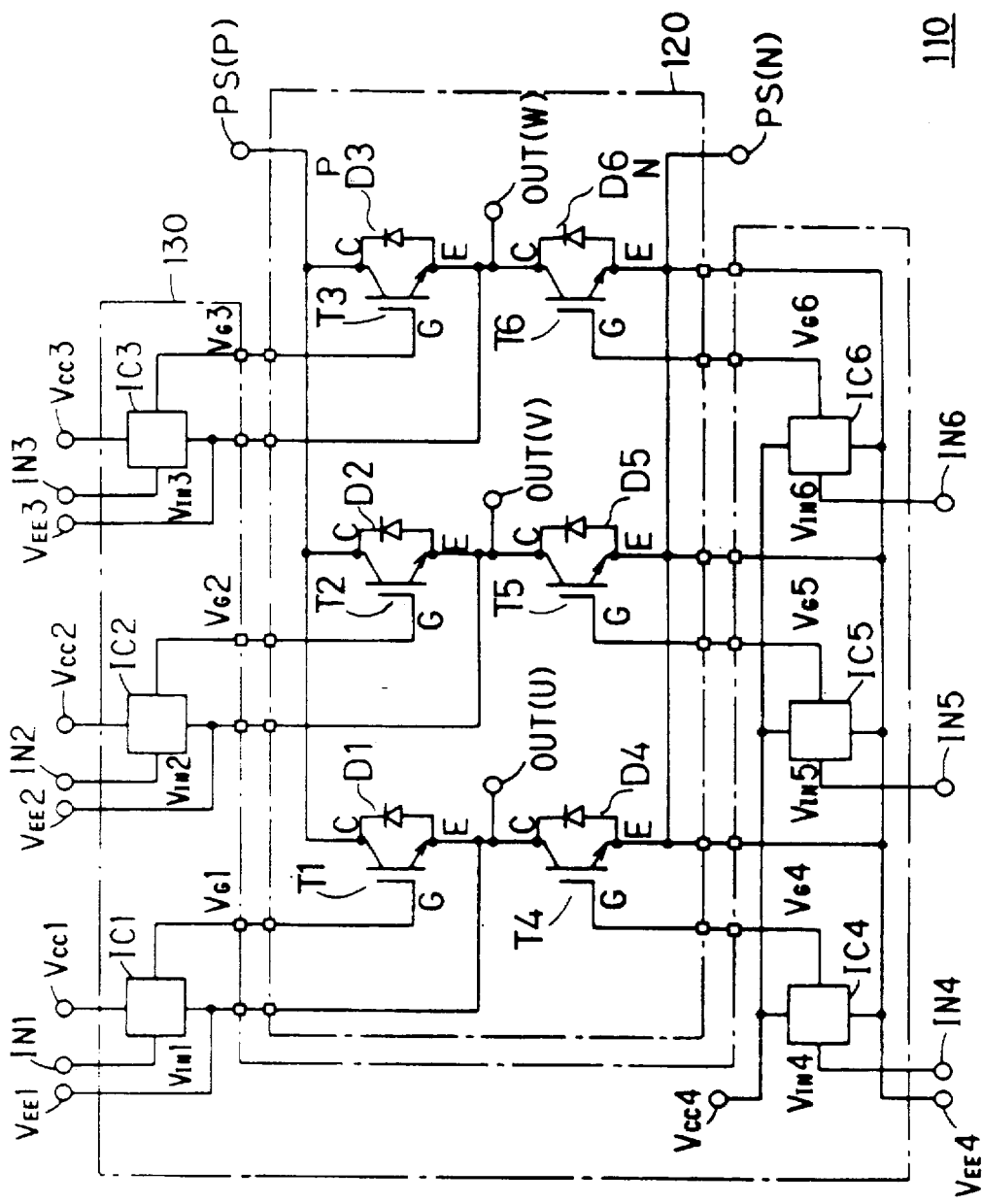
FIG. 12 is a schematic circuit diagram showing a circuit part of a conventional unit.
Figure 13:
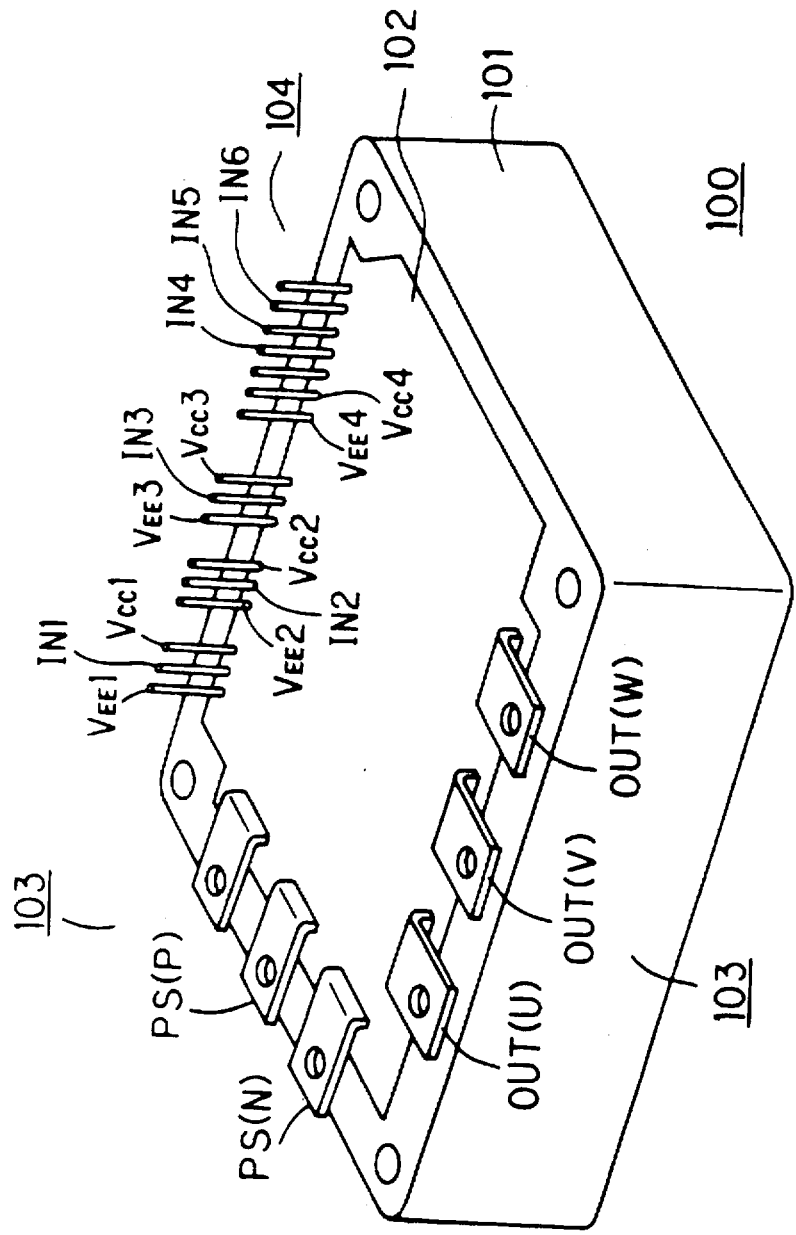
FIG. 13 is a perspective view showing the appearance of the conventional unit.
Figure 14:
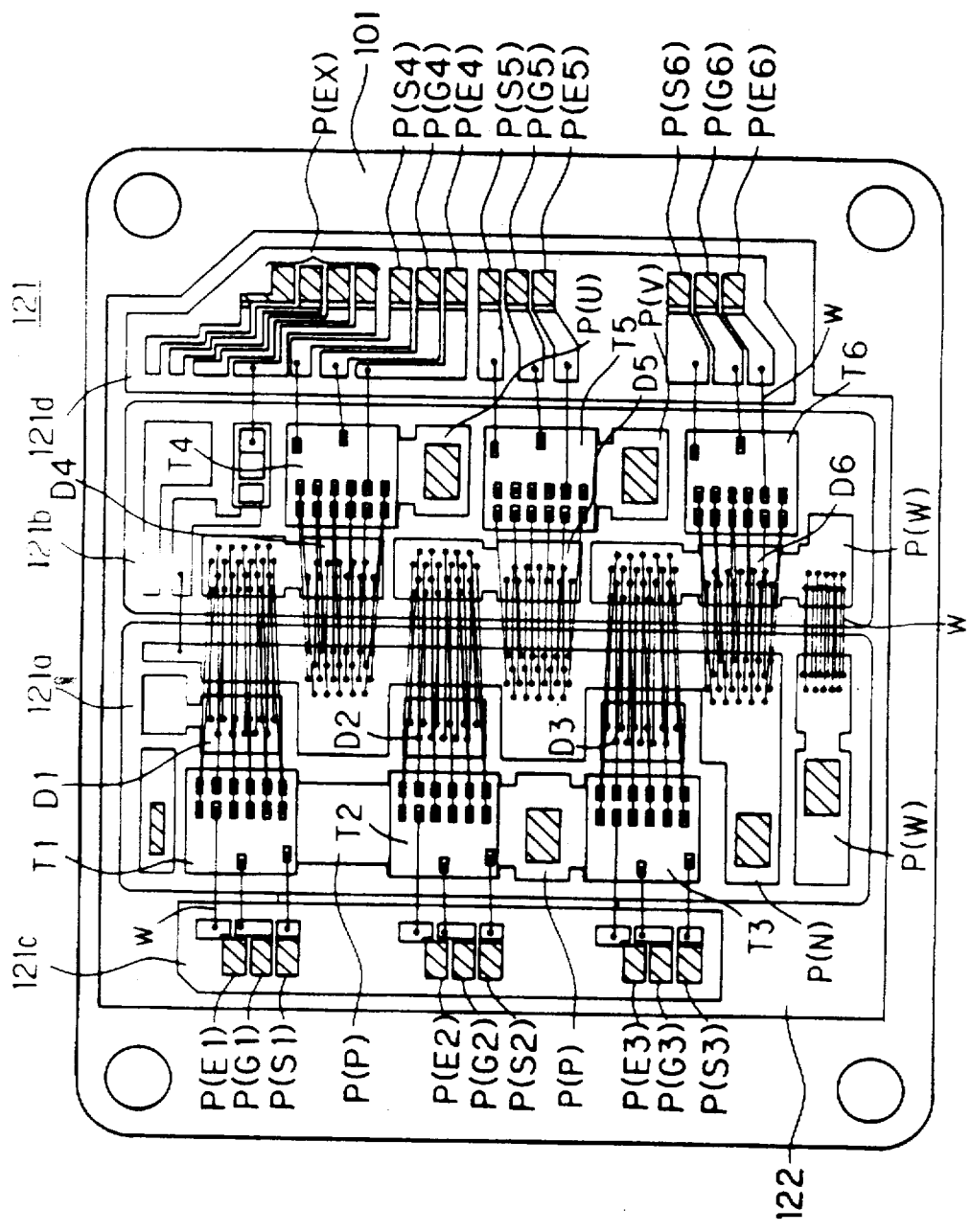
FIG. 14 is a plan view showing a main circuit of the conventional unit.
Figure 15:
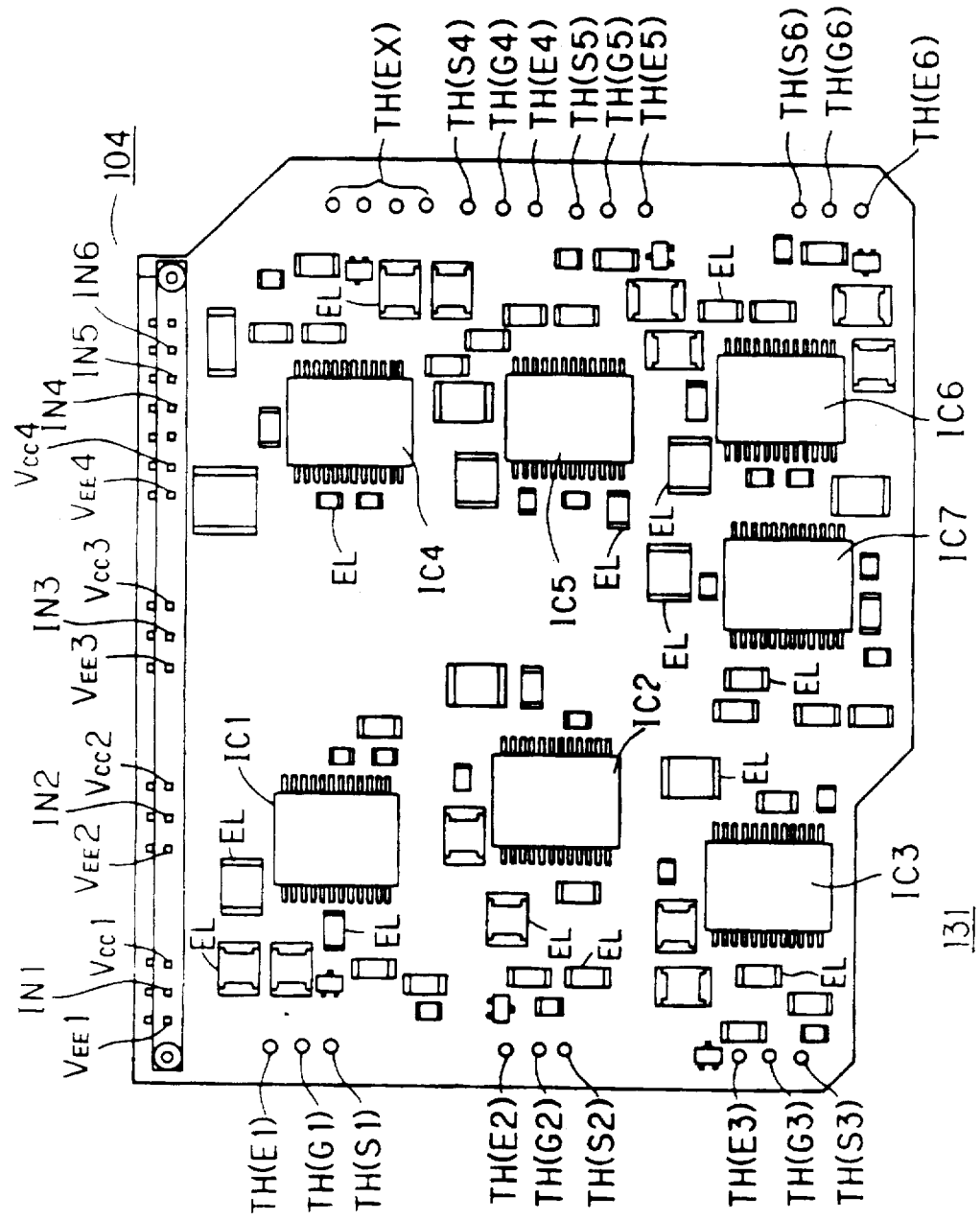
FIG. 15 is a plan view showing a control circuit of the conventional unit.
Figure 16:
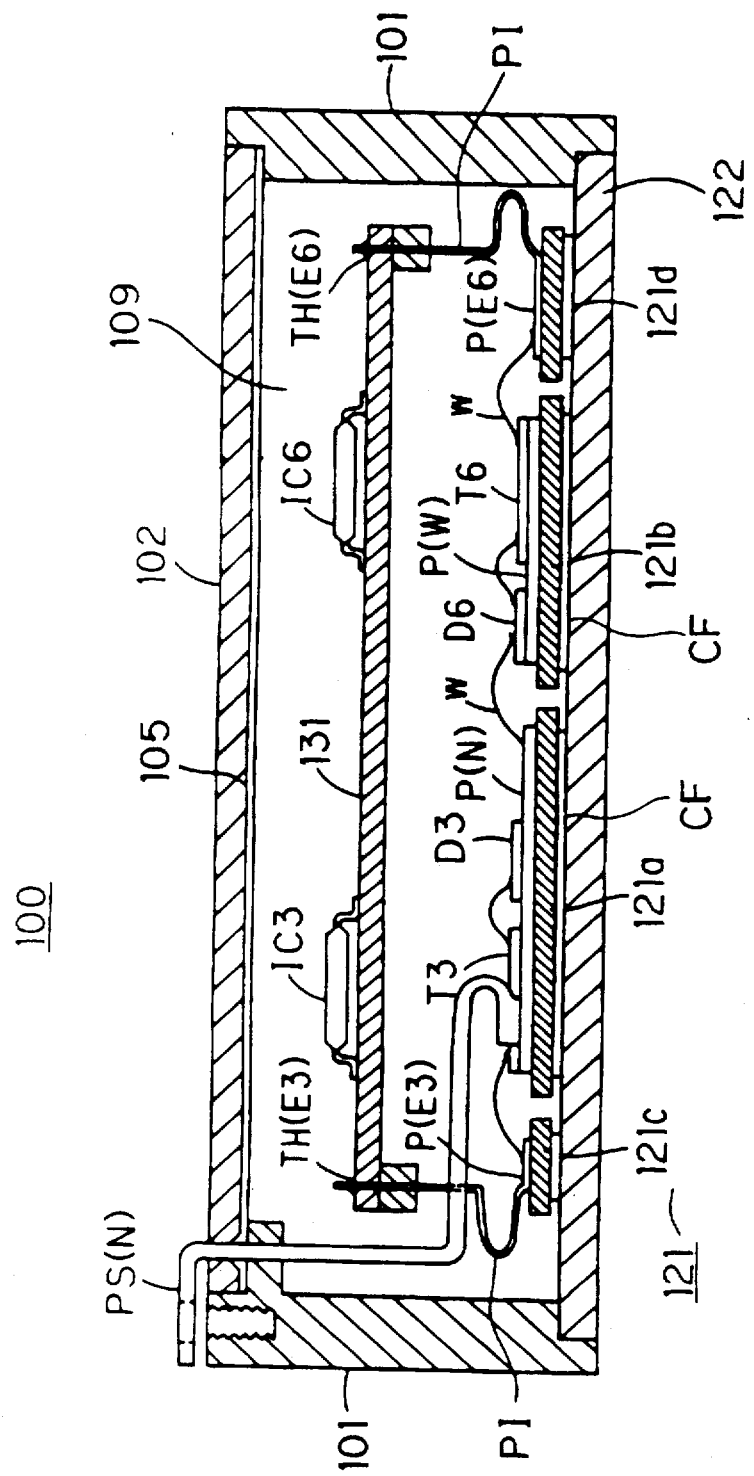
FIG. 16 is a front sectional view showing the conventional unit.

FIG. 11 is a front sectional view showing a unit 200 according to a seventh embodiment of the present invention. In the unit 200 of this embodiment, a spacer 240a is made of resin having elasticity such as silicone resin similarly to the unit 200 according to the second embodiment, while a lower major surface of the spacer 240a downwardly projects beyond that of a pattern 225 by about 0.5 to 1 mm, for example. When the unit 200 is so mounted that a lower major surface of the pattern 225 is in contact with an external heat slinger, therefore, the spacer 240a is pressed against the heat slinger with elastic force. Namely, the spacer 240a is in close contact with the heat slinger, to function as a packing. Thus, circuit elements such as IGBT elements T1 to T6 and the pattern 225 arranged on a power substrate 221 which is enclosed with the spacer 240a are protected against the outside air. Consequently, the circuit elements, the pattern 225 etc. are suppressed from deterioration caused by moisture contained in the outside air etc.

Since the spacer 240a has elasticity, an adhesive 260 may be hard similarly to the unit according to the second embodiment. Further, no high accuracy is required for dimensions of a power substrate 221 which is positioned in an opening of the spacer 240a.

[Embodiment 8]

An exemplary procedure of fabricating the unit 200 according to the first embodiment shown in FIG. 1 is now described.

(1) First, the power substrate body 222, the circuit elements of the main circuit 220 such as the IGBT elements T1 to T6, the terminals 203 of the main circuit 220 such as the power supply terminals PS(P) and PS(N), the metal plate 232 coated with the coating 233, the circuit elements of the control circuit 230 such as the semiconductor elements IC1 to IC4, the terminals 204 of the control circuit 230 such as the power supply terminals VEE1 to VEE4, the spacer 240, and the case 201 are prepared.

(2) The patterns 223 and 224 are arranged on the upper major surface of the power substrate body 222 by metallization bonding.

(3) Further, the pattern 225 is arranged on the lower major surface of the power substrate body 222 by metallization bonding, thereby forming the power substrate 221.

(4) The main circuit elements such as the IGBT elements T1 to T6, and the terminals 203 are connected to the pattern 223.

(5) The control substrate body 235 of GFRP provided with the interconnection patterns 236 and 237 are attached to the surface of the coating 233 through the adhesive 234, thereby forming the control substrate 231.

(6) The circuit elements of the control circuit 230 such as the semiconductor elements IC1 to IC4, and the terminals 204 are connected to the interconnection pattern 236.

(7) The control substrate 231 is engaged with the pattern 224 of the power substrate 221, to be arranged around the power substrate 221.

(8) The inner peripheral edge of the opening of the spacer 240 is brought into contact with the outer peripheral edge of the power substrate 221 through a silicone adhesive, while its major surface is brought into contact with that of the control substrate 231 through an adhesive. Thus, the spacer 240 is fixed to the periphery of the power substrate 221.

(9) The composite substrate 205 integrally formed by the power substrate 221, the spacer 240 and the control substrate 231 is fixed to the case 201 through an adhesive.

(10) The circuit elements and the terminals are properly connected with each other by the conductor wires w.

(11) The filler 250 of epoxy resin is filled up in the internal space of the housing for the unit 200 which is formed by the composite substrate 205 and the case 201, to be thermally hardened.

[Embodiment 9]

In a procedure of fabricating the unit according to the second embodiment of the present invention, the spacer 240 mainly composed of silicone resin is prepared in the aforementioned step (1). In the step (8), further, the adhesive employed for bonding the opening of the spacer 240 and the power substrate 221 with each other is not restricted to a flexible adhesive such as a silicone adhesive.

[Embodiment 10]

A procedure of fabricating the unit according to the third embodiment is similar to that of the eighth embodiment, while thicknesses of the power substrate body 222 and the spacer 240 prepared in the step (1) and those of the patterns 223, 224 and 225 arranged on the power substrate body 222 in the steps (2) and (3) are adjusted.

[Embodiment 11]

In a procedure of fabricating the unit according to the fourth embodiment of the present invention, holes for receiving the screw 241 are provided in the control substrate 231 and the spacer 240 in advance of the step (8) of the eighth embodiment. In the step (8), further, the inner peripheral edge of the opening of the spacer 240 is brought into contact with the outer peripheral edge of the power substrate 221 through a silicone adhesive, while the spacer 240 is fastened to the control substrate 231 by the screw 241. Thus, the spacer 240 is fixed to the periphery of the power substrate 221.

[Embodiment 12]

In a procedure of fabricating the unit according to the fifth embodiment of the present invention, the heat-conducting plate 270 is prepared, holes for receiving the screw 271 are provided in the control substrate 231 and the spacer 240, and a screw hole to be fitted with the screw 271 is provided in the heat-conducting plate 270 in advance of the step (8) of the eighth embodiment. Further, the heat-conducting plate 270 is fastened to the spacer 240 by the screw 271 in advance of the step (11).

A procedure of fabricating a unit having the heat-conducting plate 270 attached to the bottom surface of the power substrate 221 etc. by an adhesive through no screw 271, which is a modification of the fifth embodiment of the present invention, is as follows: First, the heat-conducting plate 270 is prepared in advance of the step (8) of the eighth embodiment. Further, the heat-conducting plate 270 is attached to the bottom surface of the spacer 240 or the power substrate 221, or both of these bottom surfaces through an adhesive in advance of the step (11). When the heat-conducting plate 270 is attached to the bottom surface of the power substrate 221, the adhesive is prepared from a flexible adhesive.

While the invention has been shown and described in detail, the foregoing description is in all aspects illustrative and not restrictive. It is therefore understood that numerous modifications and variations can be devised without departing from the scope of the invention.

What is claimed is:

1. A semiconductor power module comprising a box type housing storing a power switching semiconductor element repeating cutoff and connection of a current to be supplied to a load in response to a control signal, a bottom portion of said housing comprising a power substrate being integrally provided with:

a power substrate body formed of a single layer and containing a heat-resistant insulating material;

a thermally and electrically conductive power interconnection pattern being bonded to an upper major surface of said power substrate body to be connected with said power switching semiconductor element;

a thermally conductive plate being formed of a single layer and directly bonded to a lower major surface of said power substrate body, said plate being formed of a material substantially identical to that of said power interconnection pattern; and said plate being exposed on a lower surface of said housing;

wherein said heat-resistant insulating material is ceramic, wherein said power interconnection pattern substantially consists of a copper material and is arranged on said upper major surface of said power substrate body in metallization bonding, and wherein said plate substantially consists of a copper material and is arranged on said lower major surface of said power substrate body in metallization bonding;

wherein said bottom portion of said housing comprises a control substrate having:

a control substrate body substantially consisting of an insulator, an electrically conductive control interconnection pattern being arranged on an upper major surface of said control substrate body and connected with a control circuit element for producing said control signal and supplying the same to said power switching semiconductor element, and a plate type pressing member forming a multilayer structure with said control substrate body, said plate type pressing member having rigidity, said control substrate being arranged around said power substrate and engaged with an edge portion of said power substrate.

2. A semiconductor power module in accordance with claim 1, wherein said housing comprises a bottomless case being bonded to said bottom portion by an adhesive for covering an upper space of said bottom portion.

3. A semiconductor power module comprising a box type housing storing a power switching semiconductor element repeating cutoff and connection of a current to be supplied to a load in response to a control signal, a bottom portion of said housing comprising a power substrate being integrally provided with:

a power substrate body containing a heat-resistant insulating material;

a thermally and electrically conductive power interconnection pattern being one of bonded to and arranged on an upper major surface of said power substrate body to be connected with said power switching semiconductor element; and a thermally conductive plate being one of bonded to and arranged on a lower major surface of said power substrate body, said plate being formed of a material substantially identical to that of said power interconnection pattern;

said bottom portion further comprising a control substrate having:

a control substrate body substantially comprising an insulator;

an electrically conductive control interconnection pattern being arranged on an upper major surface of said control substrate body and connected with a control circuit element for producing said control signal and supplying the same to said power switching semiconductor element; and a plate type pressing member forming a multilayer structure with said control substrate body, said plate type pressing member having rigidity;

said control substrate being arranged around said power substrate and engaged with an edge portion of said power substrate;

wherein said bottom portion of said housing further comprises:

a plate-type spacer having an inner peripheral edge being provided around said power substrate to be in contact with an outer peripheral edge of said power substrate, said plate-type spacer being in contact with a lower major surface of said control substrate.

4. A semiconductor power module in accordance with claim 3, wherein the ratio of the thickness of said power interconnection pattern to that of said plate is so adjusted that said power substrate is not warped following its temperature change.

5. A semiconductor power module in accordance with claim 3, wherein said spacer has elasticity, a lower surface of said spacer being substantially flush with that of said plate.

6. A semiconductor power module in accordance with claim 3, wherein said spacer has elasticity, a lower major surface of said spacer projecting downwardly beyond that of said plate.

7. A semiconductor power module in accordance with claim 3, wherein a lower major surface of said plate projects downwardly beyond that of said spacer.

8. A semiconductor power module in accordance with claim 3, wherein said power substrate further comprises:

a contact member being arranged on an upper edge of said upper major surface of said power substrate body to be in contact with said control substrate, said contact member substantially consisting of a metal.

9. A semiconductor power module in accordance with claim 3, wherein said pressing member comprises a metal plate.

10. A semiconductor power module in accordance with claim 3, wherein said control substrate is provided with an opening passing through a central portion of its major surface, said power substrate being positioned in said opening.

11. A semiconductor power module in accordance with claim 10, wherein an upper major surface of said power substrate being positioned in said opening is located downward beyond that of said control substrate, precoating resin being provided in said opening for covering said power switching element.

12. A semiconductor power module in accordance with claim 3, wherein said inner peripheral edge of said spacer is in contact with said outer peripheral edge of said power substrate through a flexible adhesive.

13. A semiconductor power module in accordance with claim 3, wherein an upper major surface of said spacer is in contact with said lower major surface of said control substrate, said spacer and said control substrate being fixed to each other.

14. A semiconductor power module in accordance with claim 13, wherein said spacer and said control substrate are fixed to each other by an adhesive.

15. A semiconductor power module in accordance with claim 13, wherein said spacer and said control substrate are fixed to each other through a screw.

16. A semiconductor power module in accordance with claim 3, further comprising:

a thermally conductive plate-type heat-conducting plate being provided to be in contact with a lower portion of said bottom portion of said housing, said heat-conducting plate having an upper major surface being slidable along a lower major surface of said plate.

17. A semiconductor power module in accordance with claim 16, wherein said heat-conducting plate is fixed to said spacer.

18. A semiconductor power module in accordance with claim 16, wherein said upper major surface of said heat-conducting plate is mounted on said lower major surface of said plate through a flexible adhesive.

* * * * *